United States Patent
Wu et al.

(10) Patent No.: US 12,292,603 B2
(45) Date of Patent: May 6, 2025

(54) PIC STRUCTURE WITH WIRE(S) BETWEEN Z-STOP SUPPORTS ON SIDE OF OPTICAL DEVICE ATTACH CAVITY

(71) Applicant: GlobalFoundries U.S. Inc., Malta, NY (US)

(72) Inventors: Zhuojie Wu, Port Chester, NY (US); Seungman Choi, Loudonville, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 326 days.

(21) Appl. No.: 17/933,199

(22) Filed: Sep. 19, 2022

(65) Prior Publication Data
US 2024/0103237 A1   Mar. 28, 2024

(51) Int. Cl.
G02B 6/42   (2006.01)

(52) U.S. Cl.
CPC .......... *G02B 6/423* (2013.01); *G02B 6/4206* (2013.01); *G02B 6/424* (2013.01); *G02B 6/4274* (2013.01)

(58) Field of Classification Search
CPC ...... G02B 6/423; G02B 6/4206; G02B 6/424; G02B 6/4274
See application file for complete search history.

(56) References Cited

U.S. PATENT DOCUMENTS

| | | | |
|---|---|---|---|
| 9,606,308 B2 | 3/2017 | Barwicz et al. | |
| 10,064,276 B2 | 8/2018 | Williams et al. | |
| 10,678,005 B2 | 6/2020 | Kinghorn et al. | |
| 11,171,464 B1* | 11/2021 | Bishop | H01S 5/02234 |
| 11,239,190 B2 | 2/2022 | Guevara et al. | |
| 2016/0365335 A1 | 12/2016 | Black et al. | |
| 2020/0235038 A1* | 7/2020 | Adusumilli | G02B 6/12002 |
| 2020/0249405 A1* | 8/2020 | Novack | G02B 6/423 |
| 2022/0075112 A1 | 3/2022 | Cardile et al. | |

OTHER PUBLICATIONS

Bian et al., "3D Integrated Laser Attach Technology on 300-mm Monolithic Silicon Photonics Platform," 978-1-7281-5891-4/20, IEEE 2020, 2 pages.
Bian et al., "Hybrid III-V laser integration on a monolithic silicon photonic platform," M5A.2, OFC 2021, OSA 2021, 3 pages.
Giewont et al., "300-mm Monolithic Silicon Photonics Foundry Technology," IEEE Journal of Selected Topics in Quantum Electronics, 25:8200611, Sep./Oct. 2019, 12 pages.

(Continued)

*Primary Examiner* — Tina M Wong
(74) *Attorney, Agent, or Firm* — Anthony Canale; Hoffman Warnick LLC

(57) ABSTRACT

A photonic integrated circuit (PIC) structure includes a substrate, and a cavity defined in the substrate, the cavity including a shoulder at a side of the cavity. A plurality of z-stop supports for an optical device are also included. Each z-stop support of the plurality of z-stop supports is on a support portion of the shoulder. A wire extends over the side of the cavity and between at least two z-stop supports of the plurality of z-stop supports. An optical device is positioned on the plurality of z-stop supports in the cavity and electrically coupled to the wire. Electrical connections between z-stop supports allows larger sized electrical connections to the optical device to mitigate electromigration issues, and increased options for electrical connections.

20 Claims, 26 Drawing Sheets

(56) References Cited

OTHER PUBLICATIONS

Peng et al., A CMOS Compatible Monolithic Fiber Attach Solution with Reliable Performance and Self-Alignment, Th3l.4, OFC 2020, OSA 2020, 3 pages.

Tseng et al., "Effect of oxidation on electromigration in 2-um Cu redistribution lines capped with polyimide," Physics, 31:105048, 2021, 7 pages.

* cited by examiner

PIC STRUCTURE WITH WIRE(S) BETWEEN Z-STOP SUPPORTS ON SIDE OF OPTICAL DEVICE ATTACH CAVITY

BACKGROUND

The present disclosure relates to photonic integrated circuit (PIC) structures and, more particularly, to a power electrical connection for optical device attachment on a PIC structure.

Certain PIC structures attach an external optical device to a substrate for optical signal communications to the rest of the PIC structure. For example, an external laser may be attached to the substrate of the PIC structure in a cavity in the substrate. Power delivery connection wires are made to the optical device through a single input wire and single output wire at an end of the cavity. High amounts of electrical current are required for many external optical devices, which can lead to increased risks of electromigration failures in the power delivery connections, especially at higher temperature and power requirements.

FIG. 1A shows a top-down view of a conventional optical device attach cavity 10 in a PIC structure 12, FIG. 1B shows a cross-sectional view along view line B-B in FIG. 1A, and FIG. 1C shows a cross-sectional view along view C-C in FIG. 1A. As noted, certain PIC structures 12 attach an external optical device 20 to a substrate 22 for optical signal communications to the rest of PIC structure 12, e.g., integrated circuits and other optical devices therein. (Optical device 20 is illustrated with a dashed box in FIG. 1A to illustrate a bottom of cavity 10 defined in substrate 22.) For example, an external laser 30 may be attached to substrate 22 of IC structure 12 in cavity 10 in substrate 22. Power delivery connection wires 32, 34 are made to optical device 20 through a single input wire 32 and a single output wire 34 at an end 36 of cavity 10. Among other challenges, high electrical current is required for many external optical devices 20, which can increase risks of electromigration failures in power delivery connections 32, 34, especially at higher temperature and power requirements.

SUMMARY

All aspects, examples and features mentioned below can be combined in any technically possible way.

An aspect of the disclosure provides a photonic integrated circuit (PIC) structure, comprising: a substrate; a cavity defined in the substrate, the cavity including a first shoulder at a first side of the cavity; a first plurality of z-stop supports for an optical device, each z-stop support of the first plurality of z-stop supports on a first support portion of the first shoulder; a first wire extending over the first side of the cavity and between at least two z-stop supports of the first plurality of z-stop supports; and an optical device positioned on the first plurality of z-stop supports in the cavity and electrically coupled to the first wire.

An aspect of the disclosure includes a photonic integrated circuit (PIC) structure, comprising: a substrate; a laser attach cavity defined in the substrate, the laser attach cavity including a first shoulder on a first side of the laser attach cavity and a second shoulder on a second, opposing side of the laser attach cavity from the first side; a first plurality of z-stop supports supporting a laser, each z-stop support of the first plurality of z-stop supports on a support portion of the first shoulder; a second plurality of z-stop supports supporting the laser, each z-stop support of the second plurality of z-stop supports on a support portion of the second shoulder; a first wire extending over the first side of the cavity and between two of the first plurality of z-stop supports; a second wire extending over the second side of the cavity and between two of the second plurality of z-stop supports; and a laser positioned on the first plurality of z-stop supports and on the second plurality of z-stop supports in the laser attach cavity, the laser electrically coupled to the first wire and the second wire.

An aspect of the disclosure includes a method comprising: forming a plurality of z-stop supports on a substrate; forming a cavity for receiving an optical device in the substrate adjacent each of the plurality of z-stop supports, the cavity including a shoulder at a side thereof; and forming at least one wire extending over the side of the cavity and laterally between at least two z-stop supports of the plurality of z-stop supports.

Two or more aspects described in this disclosure, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein.

Figure 1A:
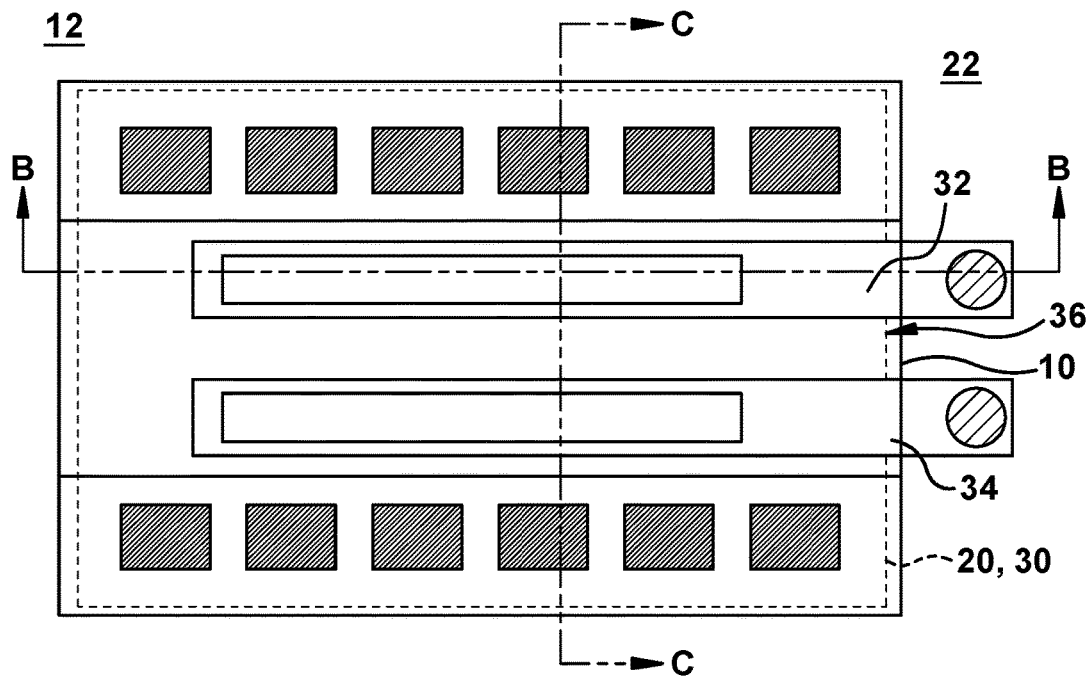
FIGS. 1A-C show various views of a conventional optical device attach cavity.
Figure 1B:
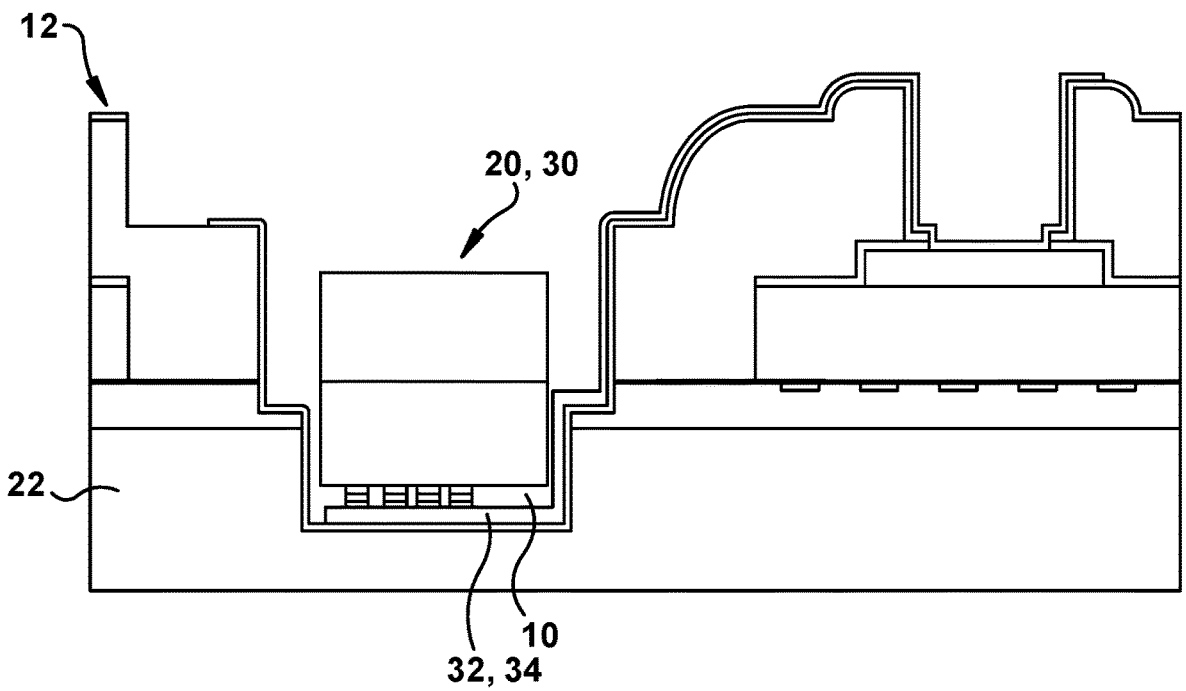
Figure 1C:
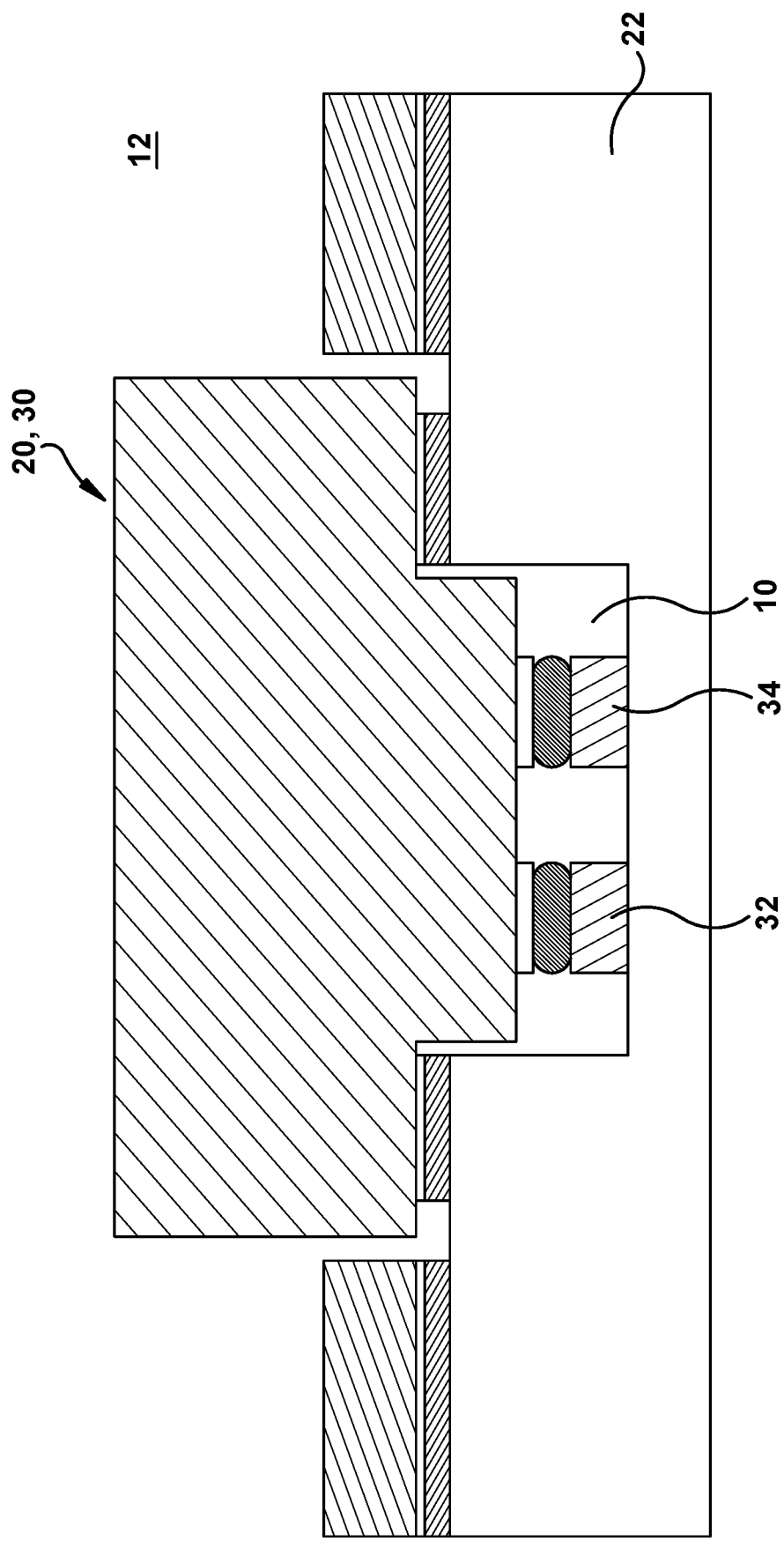

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a photonic integrated circuit (PIC) structure having electrical connections between z-stop supports on a side of an attach cavity for an optical device. The PIC structure includes a substrate, and the cavity is defined in the substrate. The cavity includes a shoulder at a side of the cavity. A plurality of z-stop supports for an optical device are also included with each z-stop support on a support portion of the shoulder. One or more wires extends over the side of the cavity and between at least two z-stop supports. The wire(s) can extend through a cavity extension between support portions of the shoulder for the z-stop supports. Alternatively, the z-stop supports can be formed partially into a base semiconductor layer of the substrate, such that the wire(s) is thinner than each of the z-stop supports so the wire(s) can extend over the side of the cavity including the shoulder of the cavity. An optical device is positioned on the z-stop supports in the cavity and is electrically coupled to the wire(s). The wire and z-stop support arrangement can be used on one or both sides of the cavity. Electrical connections between z-stop supports allows larger sized electrical connections to the optical device to mitigate electromigration issues. In addition, the electrical connections increase thermal dissipation, lower power consumption, and increase electrical input/output (I/O) capabilities and options. The increased I/O capabilities enable, for example, additional CMOS-optical device communication, sensors, controls, monitors, feedback loops, thermal management, driver circuits, and other device functions.

Figure 2:
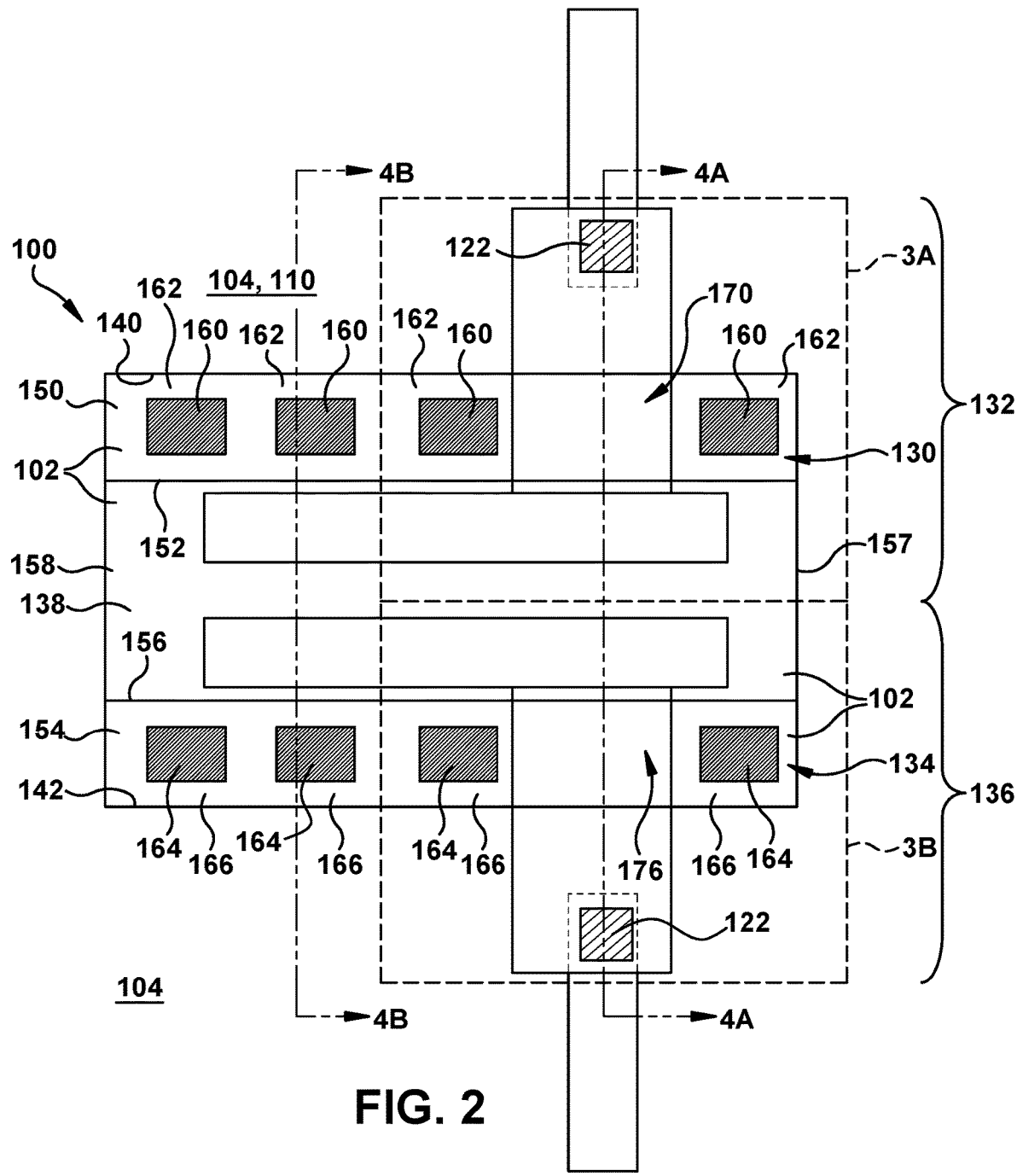
FIG. 2 shows a schematic top-down view of a PIC structure, according to embodiments of the disclosure.
Figure 3A:
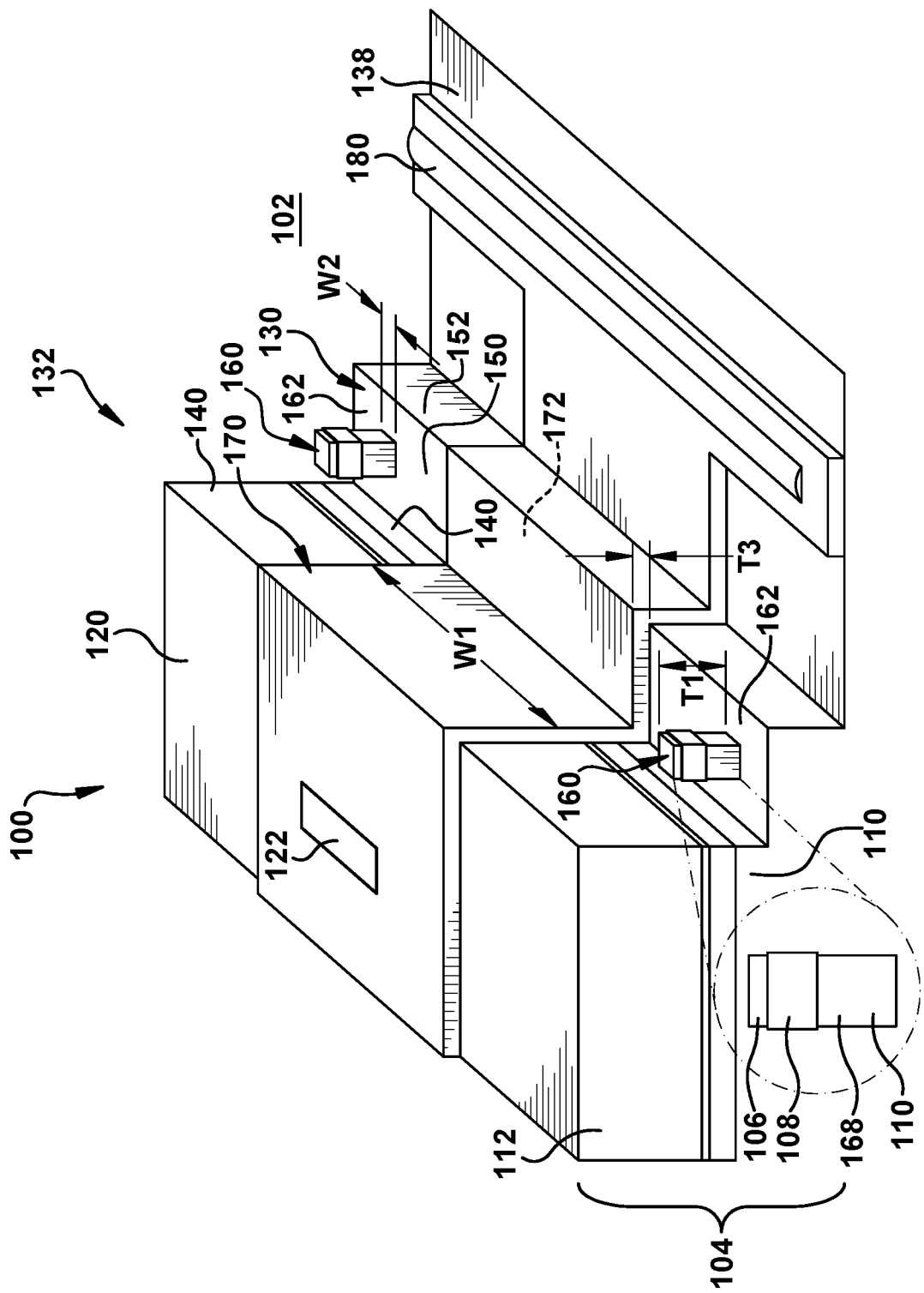
FIGS. 3A-B show perspective views of the PIC structure from view boxes 3A and 3B, respectively, in FIG. 2.
Figure 3B:
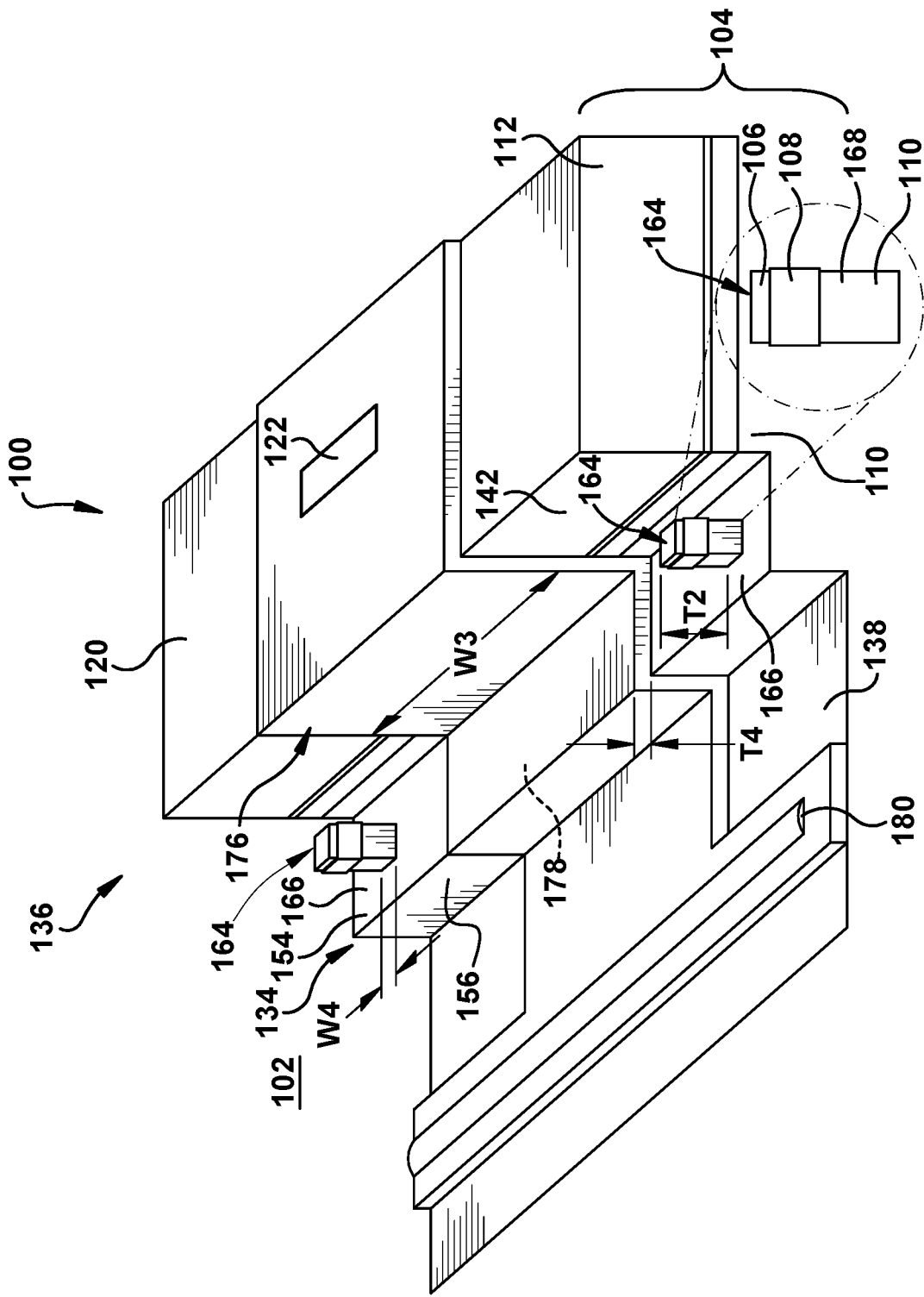
Figure 4A:
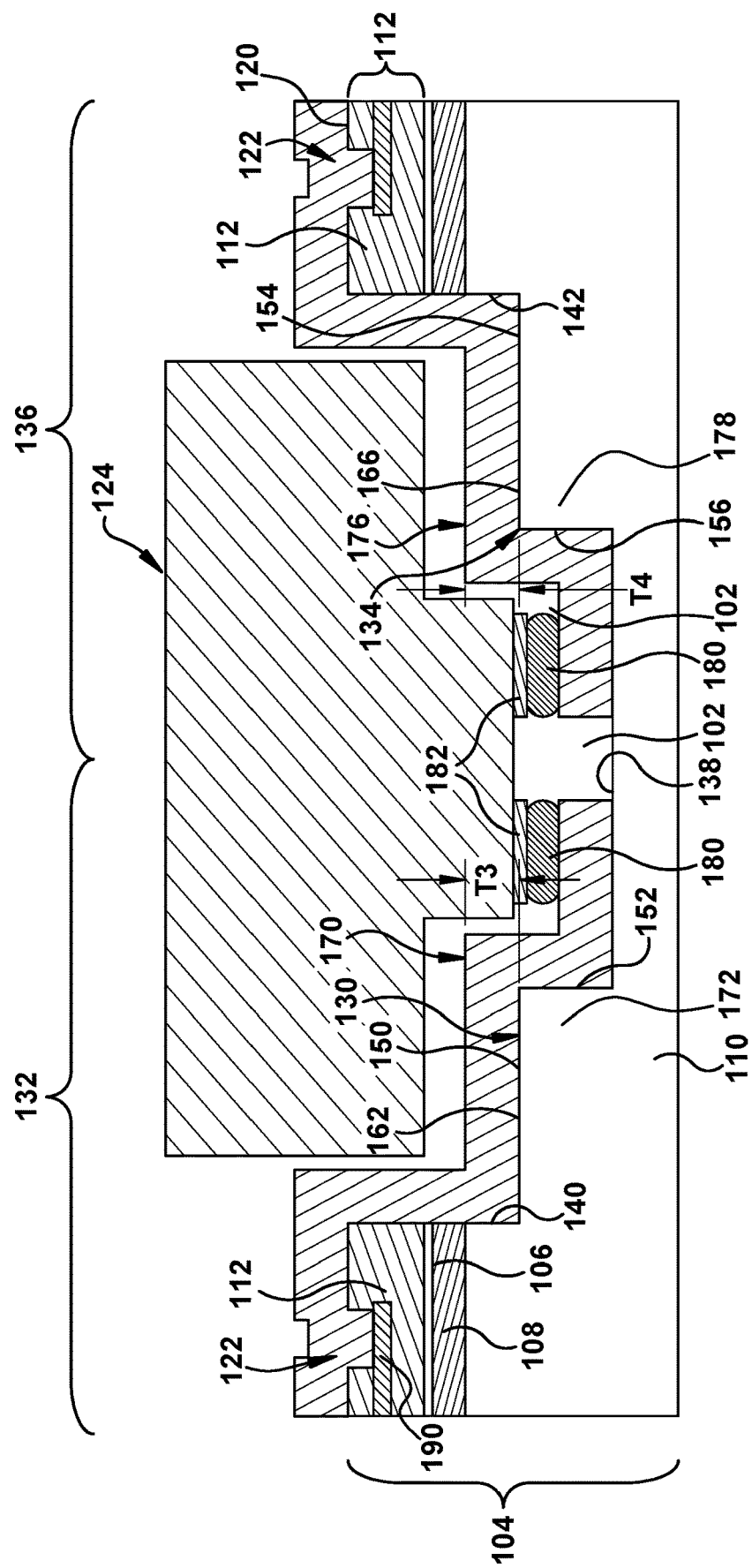
FIG. 4A shows a cross-sectional view of the PIC structure along view line 4A-4A in FIG. 2, according to embodiments of the disclosure.
Figure 4B:
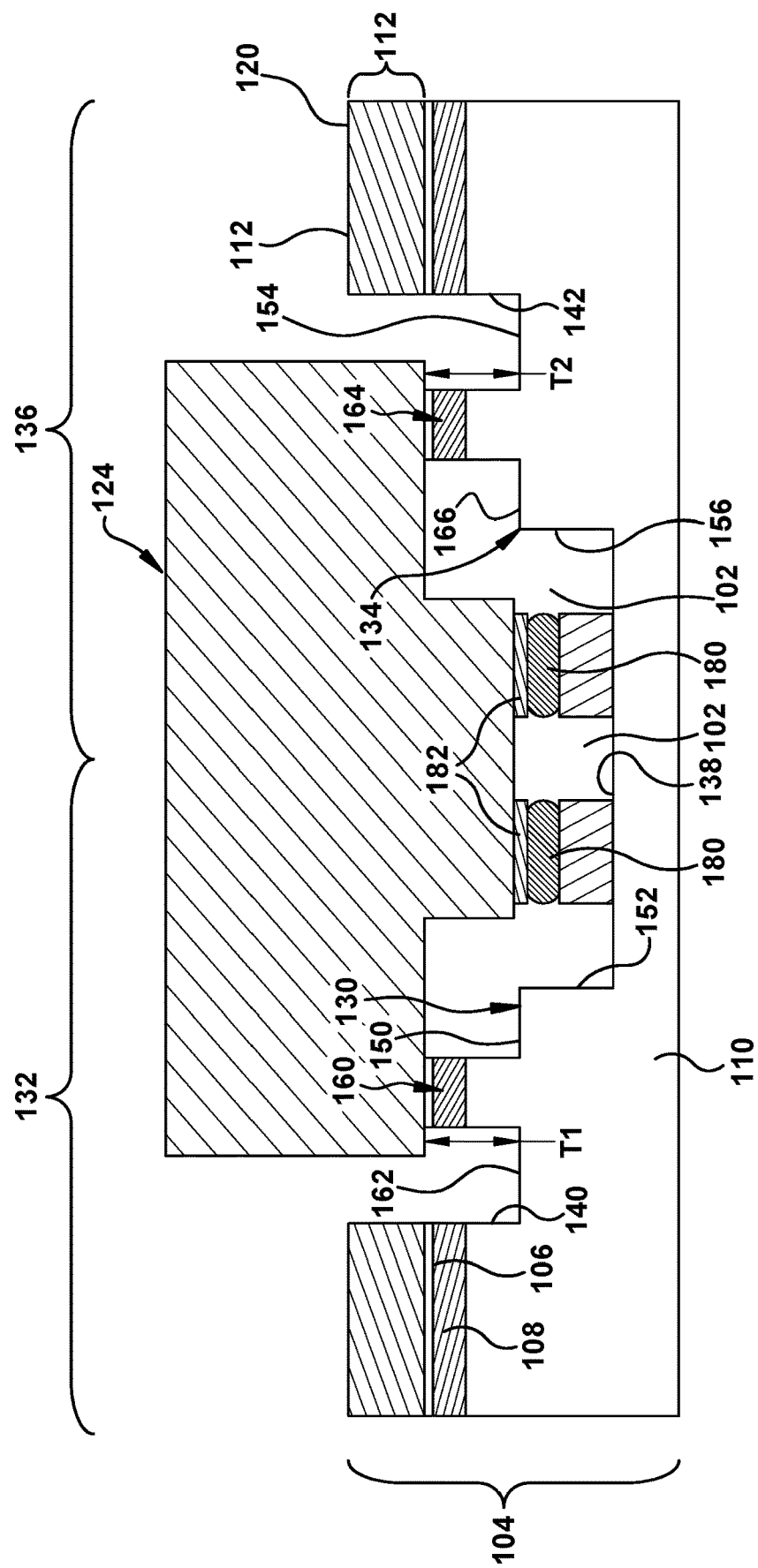
FIG. 4B shows a cross-sectional view of the PIC structure along view line 4B-4B in FIG. 2, according to embodiments of the disclosure.

FIGS. 2-4B show various views of a PIC structure 100 according to embodiments of the disclosure. FIG. 2 shows a schematic top-down view of a PIC structure 100 according to embodiments of the disclosure. An optical device is omitted in FIG. 2 to illustrate a bottom of a cavity 102 defined in a substrate 104. FIG. 3A shows a perspective view of PIC structure 100 within view box 3A in FIG. 2; FIG. 3B shows a perspective view of PIC structure 100 within view box 3B in FIG. 2, and FIGS. 4A-B show cross-sectional views of PIC structure 100 along view lines 4A-4A and 4B-4B in FIG. 2, respectively.

PIC structure 100 includes substrate 104. Substrate 104 may include any now known or later developed photonic integrated circuit substrate and related components. For purposes of description, lower levels of substrate 104 are illustrated and described as a semiconductor-on-insulator (SOI) substrate. An SOI substrate includes a layered semiconductor-insulator-semiconductor substrate in place of a more conventional silicon substrate (bulk substrate). Substrate 104 includes a semiconductor-on-insulator (SOI) layer 106 over a buried insulator layer 108 over a base semiconductor layer 110. SOI layer 106 and base semiconductor layer 110 may include but are not limited to: silicon, germanium, silicon germanium, or silicon carbide. Buried insulator layer 108 may include any appropriate dielectric such as but not limited to silicon dioxide, i.e., forming a buried oxide (BOX) layer. Alternatively, the lower levels of substrate 104 may include any now known or later developed semiconductor substrate, e.g., bulk silicon. The lower levels of substrate 104 may include any form of logic devices and/or photonic components therein or thereover. Substrate 104 also includes a plurality of back-end-of-line dielectric interconnect layers 112 (hereafter "interconnect layers 112") positioned over SOI layer 106 which provide any form of scaling and electrical interconnection to components in, among other layers, SOI layer 106, in a known fashion.

PIC structure 100 also includes an optical device attach cavity 102 (hereafter "cavity 102") defined in substrate 104. Cavity 102 is positioned in any appropriate layer(s) of substrate 104 for the type of optical device used. In the example shown, cavity 102 extends through interconnect layers 112, SOI layer 106, BOX layer 108 and into base semiconductor layer 110. Uppermost dielectric layer(s) 120 of interconnect layers 112 may include an RDL wire to aluminum (RDL-to-Al) contact via 122 (hereafter "contact via 122") connecting wire(s) 170, 176 (described herein) and an aluminum interconnect wire 190 (in ILD 112) through which electrical connections are made to an optical device 124 in cavity 102. Optical device 124 may include any device capable of receiving and/or transmitting an optical signal to/from the rest of PIC structure 100 such as, but not limited to, a laser. Optical device 124 requires delivery of electrical power through power delivery wires to operate and may require delivery of control signals through control signal wires. With brief reference to FIG. 20, optical device 124 may optically communicate with other functional components 300 of PIC structure 100, e.g., photodetectors, logic, modulators, etc., via any form of optical waveguide 302, e.g., silicon, silicon nitride, within substrate 104.

Referring to FIGS. 2-4B, cavity 102 is defined in substrate 104 and includes a first shoulder 130 at a first side 132 of cavity 102. Cavity 102 may also include a second shoulder 134 on a second, opposing side 136 of cavity 102 from first side 132. Cavity 102 also includes a lower surface 138 between first and second shoulders 130, 134, and vertical sidewalls 140, 142 extending above first and second shoulders 130, 134, respectively. First shoulder 130 may include an upper surface 150 and a vertical sidewall 152 coupling upper surface 150 to lower surface 138. Second shoulder 134 may include an upper surface 154 and a vertical sidewall 156 coupling upper surface 154 to lower surface 138. As shown in FIG. 2, cavity 102 may also include opposing ends 157, 158 that are perpendicular to first and second sides 132, 136. Ends 157, 158 are distinguishable from sides 132, 136 because they do not include shoulders 130, 134. Sides 132, 136 are also longer than ends 157, 158. Where optical device 124 includes a laser, cavity 102 may be referenced herein as a 'laser attach cavity.'

As shown in FIGS. 2, 3A and 4B, PIC structure 100 also includes a first plurality of z-stop supports 160 for optical device 124. Each z-stop support 160 of first plurality of z-stop supports is on a first support portion 162 of first shoulder 130. As shown in FIGS. 2, 3B and 4B, PIC structure 100 may also include second plurality of z-stop supports 164. Each z-stop support 164 of the second plurality of z-stop supports is on a second support portion 166 of second shoulder 134. As shown in FIG. 4B, first support portion(s) 162 and second support portions 166 for respective z-stop supports 160, 164 (and shoulders 130, 134) may each include a portion of base semiconductor layer 110. In certain embodiments, first and second sides 132, 136 of cavity 102 may be generally identical, i.e., symmetrical. However, as will be described, this is not necessary in all cases.

Each z-stop support 160, 164 may include any now known or later developed structure to vertically position optical device 124 within cavity 102. In certain embodiments, as will be described herein, z-stop supports 160, 164 include a portion of SOI layer 106 and a portion of BOX layer 108. As shown in FIGS. 2-4B and the enlarged areas of FIGS. 3A-B, in addition to portions of SOI layer 106 and BOX layer 108, each z-stop support 160, 164 in further embodiments may include a lowermost section 168 including a portion of base semiconductor layer 110. More particularly, z-stop supports 160, 164 extend into base semiconductor layer 110 (which increases their overall thickness T1, T2, respectively) relative to a surface 150, 154 upon which they rest or extend. As noted, support portions 162, 166 for a respective z-stop support 160, 164 also includes a portion of base semiconductor layer 110. Thicknesses of z-stop supports 160, 164, as described herein, are calculated from an upper surface 150, 154 of respective first or second shoulders 130, 134.

As shown in FIGS. 2, 3A and 4A, PIC structure 100 also includes a first wire 170 extending over first side 132 of cavity 102 and between at least two z-stop supports 160 of the first plurality of z-stop supports (on first side 132 of cavity 102). In this embodiment, first wire 170 extends over first side 132 of cavity 102 including over a first portion 172 of first shoulder 130. First portion 172 may be, but is not necessarily in all cases, between first support portions 162 for z-stop supports 160. PIC structure 100 may also include, as shown in FIGS. 2, 3B and 4A, a second wire 176 extending over second side 136 of cavity 102 and between at least two z-stop supports 164 of the second plurality of z-stop supports. In this embodiment, second wire 176 extends over second side 136 of cavity 102 including over a second portion 178 of second shoulder 134. Second portion 178 may be, but is not necessarily in all cases, between second support portions 166 for z-stop supports 164. One or both wires 170, 176 may be used. Where both wires are provided, first wire 170 extends over first side 132 of cavity 102 including over first portion 172 of first shoulder 130, and second wire 176 extends over second side 136 of cavity 102 including over second portion 178 of second shoulder 134.

For first wire 170 to pass over first side 132 of cavity 102, first wire 170 is thinner than each of first plurality of z-stop supports 160. More particularly, first wire 170 has a thickness T3 that is thinner than thickness T1 of each z-stop support 160, which allows first wire 170 to extend over first side 132 of cavity 102 rather than out an end 157, 158 (FIG. 2). Similarly, for second wire 176 to pass over second side 136 of cavity 102, second wire 176 is thinner than each of second plurality of z-stop supports 164. More particularly, second wire 176 has a thickness T4 that is thinner than thickness T2 of each z-stop support 164, which allows second wire 176 to extend over second side 136 of cavity 102 rather than out an end 157, 158 (FIG. 2). Where both wires 170, 176 are used, first wire 170 is thinner than each of first plurality of z-stop supports 160, and second wire 176 is thinner than each of second plurality of z-stop supports 164. More particularly, first wire 170 has a thickness T2 that is thinner than thickness T1 of each z-stop support 160, and second wire 176 has a thickness T4 that is thinner than thickness T2 of each z-stop support 164. In this manner, first and second wires 170, 176 can extend over first and second sides 132, 136 in any desired location amongst z-stop supports 160, 164.

Figure 5A:
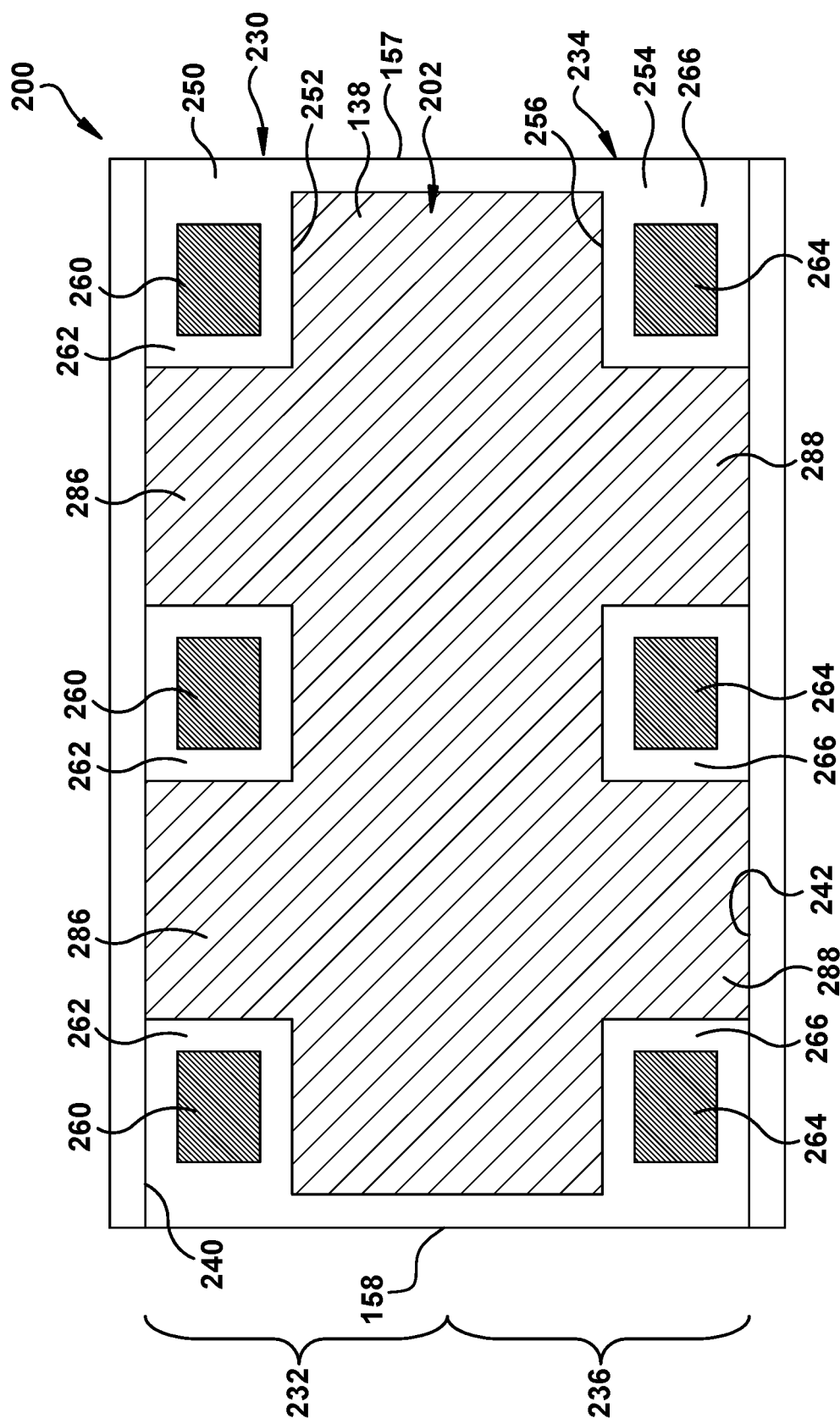
FIG. 5A shows a schematic top-down view of a cavity for PIC structure, according to embodiments of the disclosure.
Figure 5B:
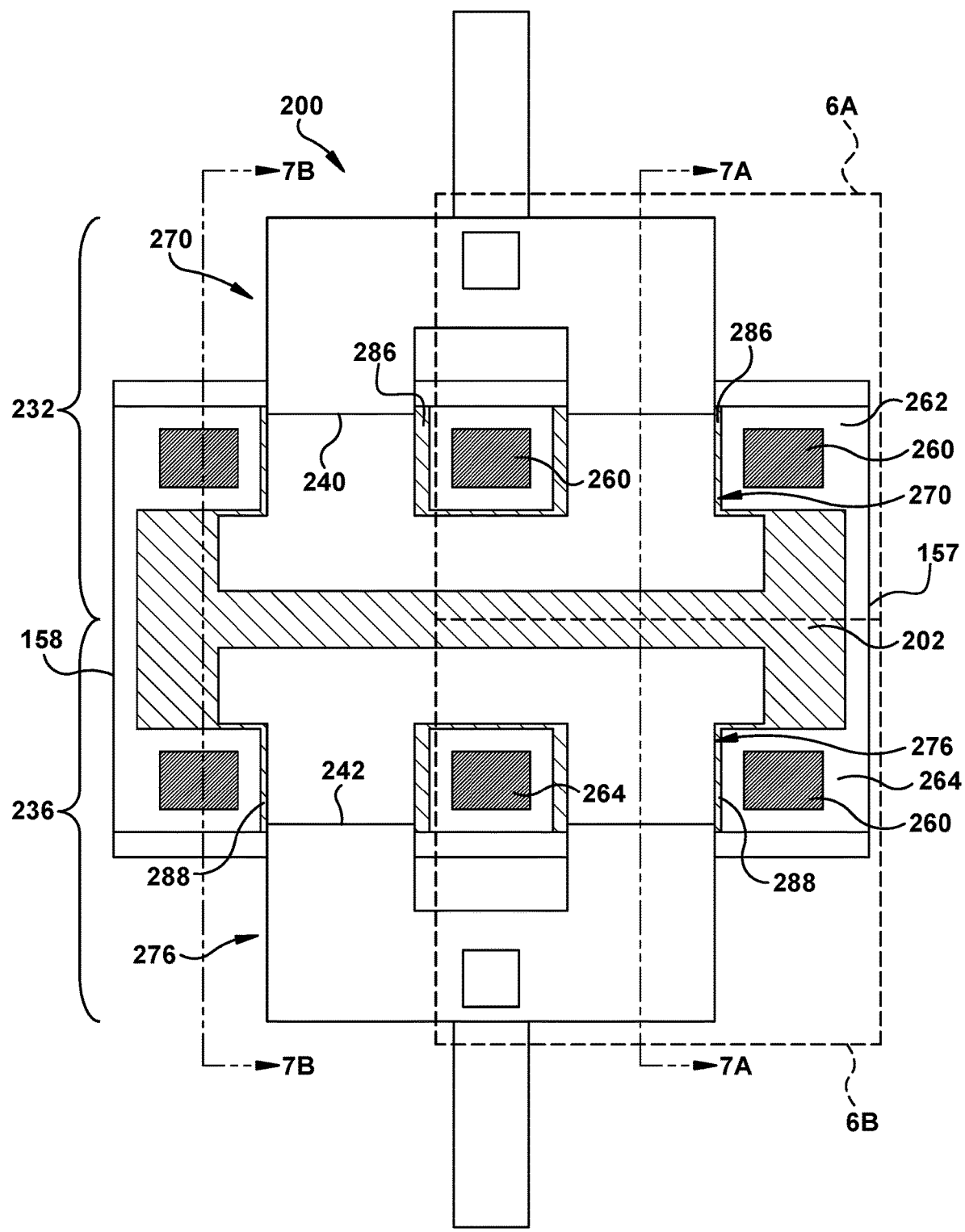
FIG. 5B shows a schematic top-down view of a PIC structure with wires in the cavity of FIG. 5A, according to embodiments of the disclosure.
Figure 6A:
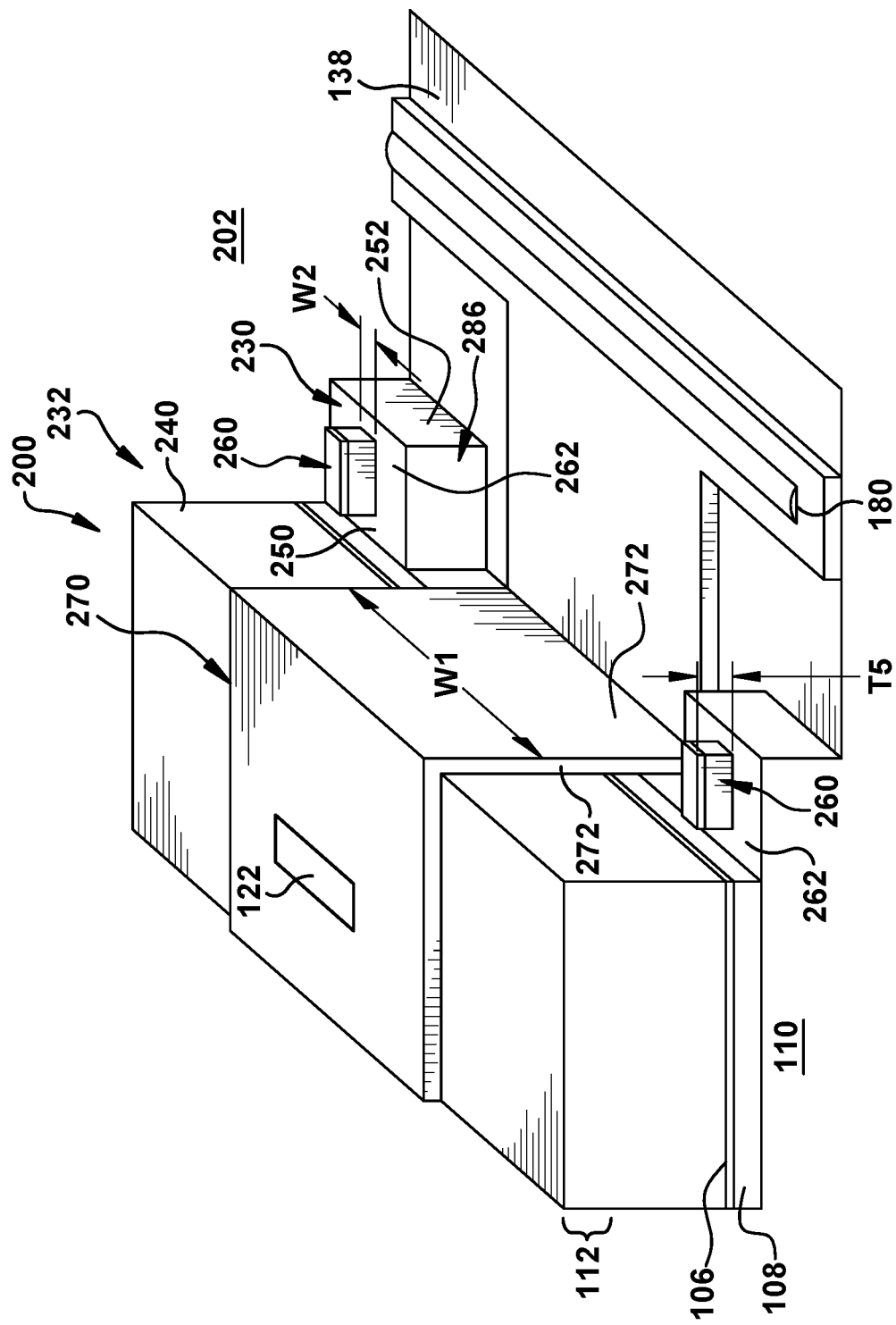
FIGS. 6A-B show perspective views of the PIC structure from view boxes 6A and 6B, respectively, in FIG. 5B.
Figure 6B:
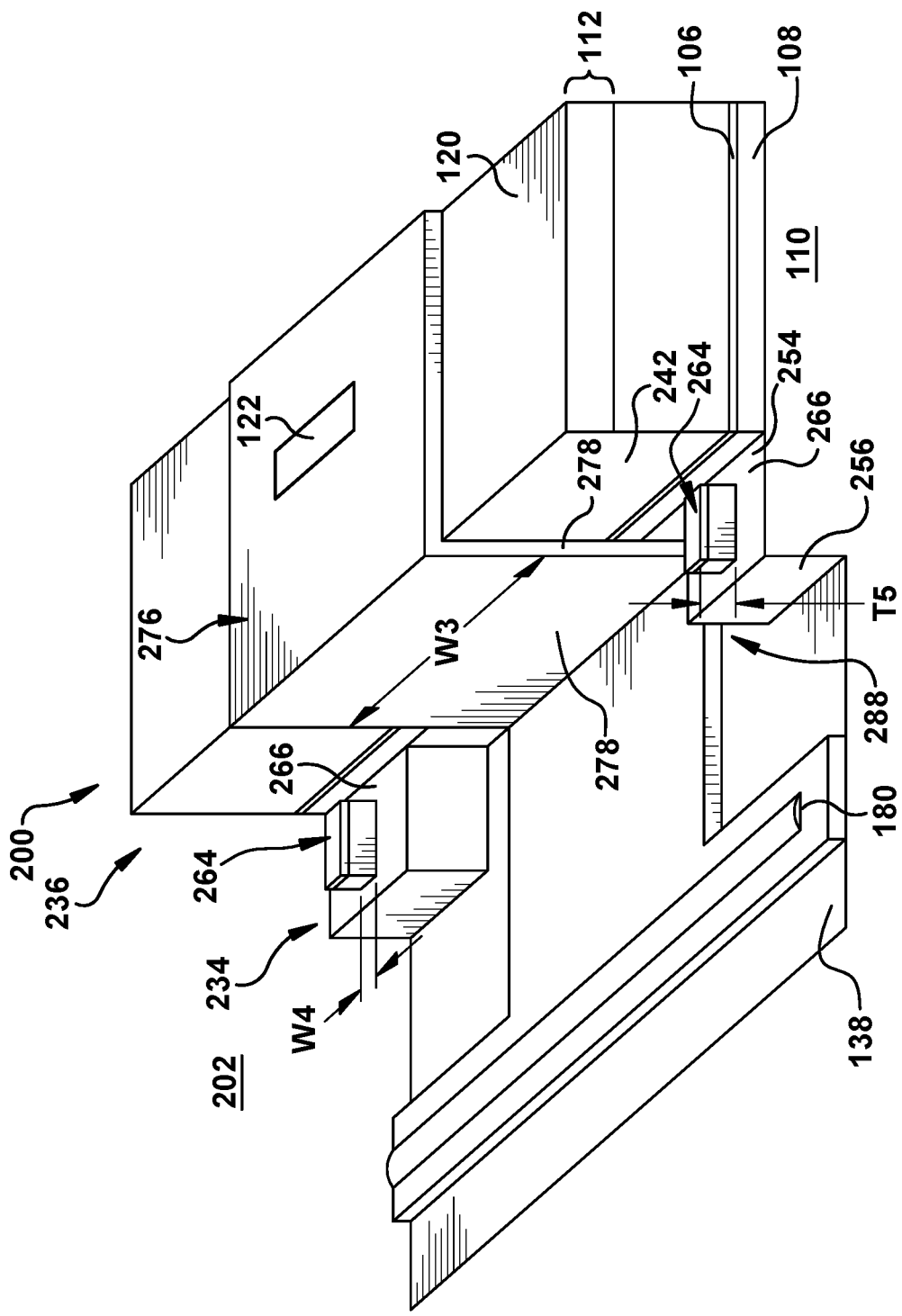
Figure 7A:
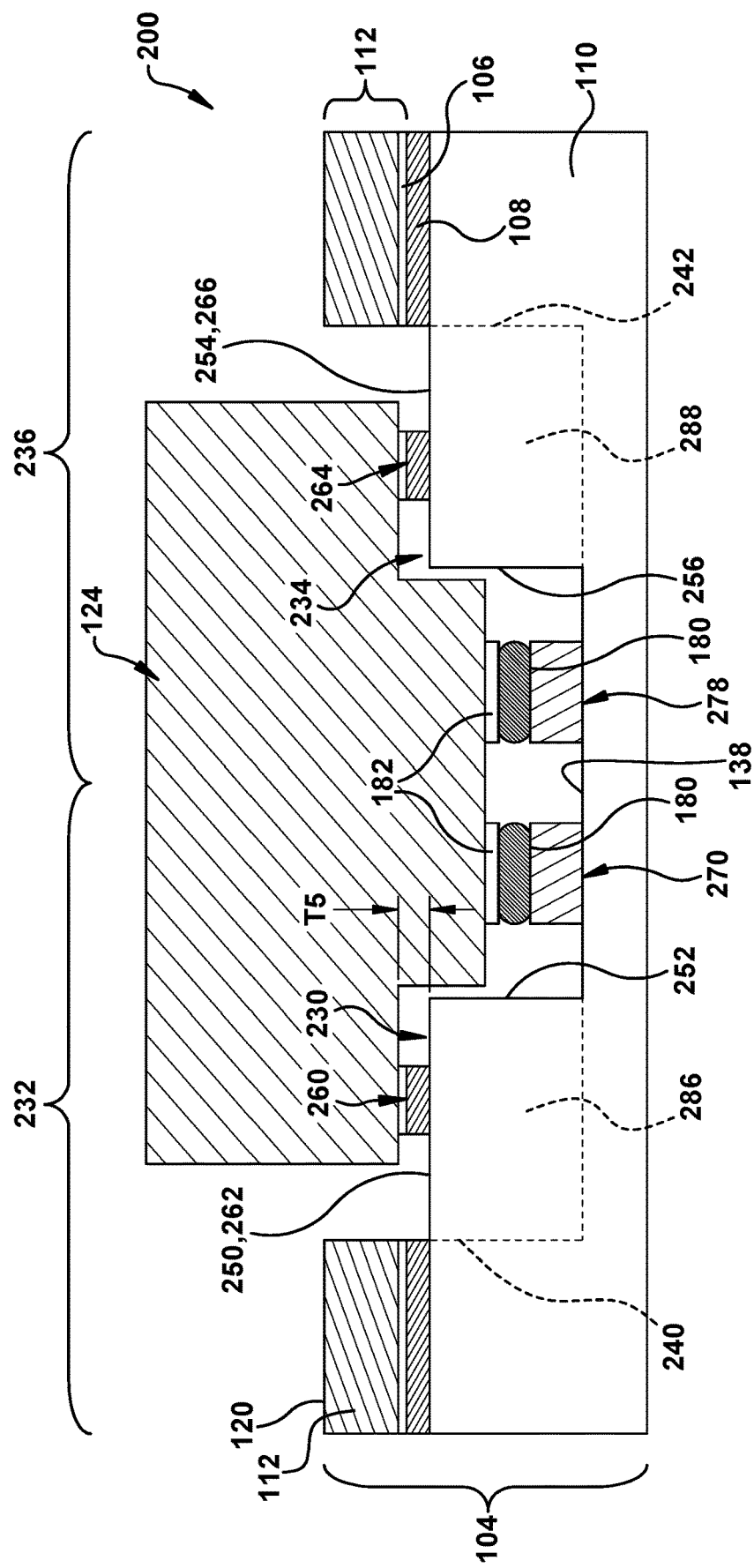
FIG. 7A shows a cross-sectional view of the PIC structure along view line 7A-7A in FIG. 5B, according to embodiments of the disclosure.
Figure 7B:
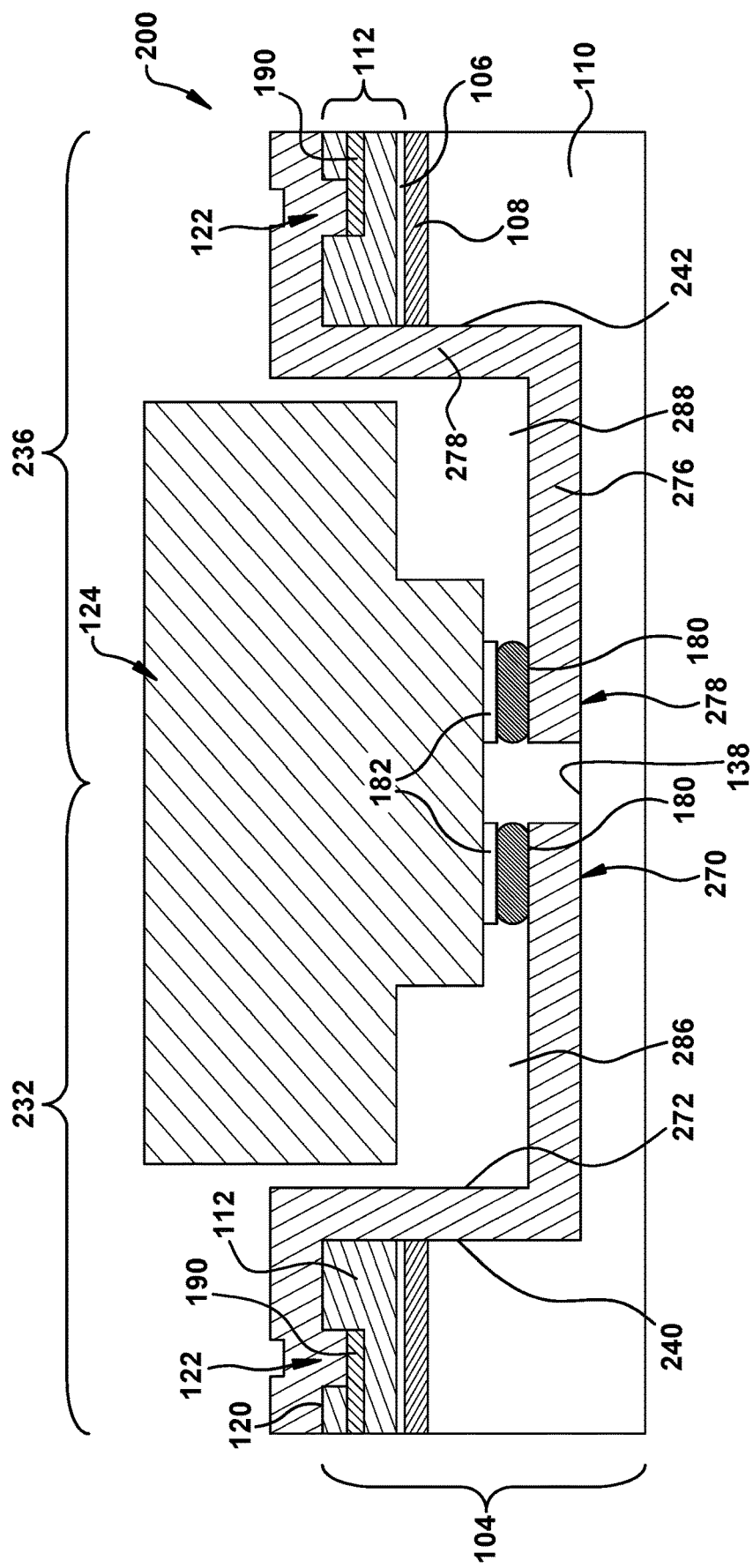
FIG. 7B shows a cross-sectional view of the PIC structure along view line 7B-7B in FIG. 5B, according to embodiments of the disclosure.

As shown in FIGS. 4A-B, PIC structure 100 also includes optical device 124 positioned on first plurality of z-stop supports 160 in cavity 102 and electrically coupled to first wire 170. In addition, optical device 124 is positioned on second plurality of z-stop supports 164 in cavity 102 and electrically coupled to second wire 176. For example, where a laser is used, the laser is positioned on first plurality of z-stop supports 160 and on second plurality of z-stop supports 164 in the laser attach cavity. The laser is electrically coupled to first wire 170 and second wire 176. Wires 170, 176 can also extend along lower surface 138 of cavity 102 in any manner to allow connection to optical device 124. Wires 170, 176 may be coupled to optical device 124 in any now known or later developed manner such as but not limited to: a solder 180 coupling wires 170, 176 to mating wire bond pads 182 on optical device 124. Wires 170, 176 and, hence, optical device 124 can be electrically coupled to other components in PIC structure 100 by way of contact vias 122 (e.g., in uppermost dielectric layer(s) 120 of interconnect layers 112). Wires 170, 176 may be coupled to a power source (not shown) for communicating power to/from optical device 124, and/or a large variety of other devices (not shown) for communicating control signals to/from optical device 124. Other devices may include but are not limited to structures to provide additional CMOS-optical device communication, sensors, controls, monitors, feedback loops, thermal management, driver circuits, and other device functions Referring to FIGS. 5A-7B, a PIC structure 200 according to an alternative embodiment of the disclosure is illustrated. The FIGS. 5A-7B embodiment is similar to the FIGS. 2-4B embodiment, except rather than increase a thickness of the z-stop supports, parts of the shoulders in the cavity are removed, creating cavity extensions that allow wires to pass over the respective sides between at least two of the z-stop supports. FIG. 5A shows a schematic top-down view of a cavity 202 for a PIC structure 200, and FIG. 5B shows a schematic top-down view of PIC structure 200 (including wires but no optical device) according to embodiments of the disclosure. An optical device is omitted in FIGS. 5A-B to illustrate a bottom of cavity 202 defined in substrate 104 and the wire layout. FIG. 6A shows a perspective view of PIC structure 100 within view box 6A in FIG. 5B; FIG. 6B shows a perspective view of PIC structure 100 within view box 6B in FIG. 5B, and FIGS. 7A-B show cross-sectional views of PIC structure 100 along view lines 7A-7A and 7B-7B in FIG. 5B, respectively.

In this embodiment, cavity 202 is defined in substrate 104 and includes a first shoulder 230 at a first side 232 of cavity 202. In FIG. 5A-B, cavity 202 is illustrated with darker shading. Cavity 202 may also include a second shoulder 234 on a second, opposing side 236 of cavity 202 from first side 232. Cavity 202 also includes a lower surface 138 between first and second shoulders 230, 234, and vertical sidewalls 240, 242 extending above first and second shoulders 230, 234, respectively. First shoulder 230 may include an upper surface 250 and a vertical sidewall 252 coupling upper surface 250 to lower surface 138. Second shoulder 234 may include an upper surface 254 and a vertical sidewall 256 coupling upper surface 254 to lower surface 138. As shown in FIG. 7A, first support portions 262 and second support portions 266 for a respective z-stop support 260, 264 may each include a portion of base semiconductor layer 110. As shown in FIGS. 5A-B, cavity 202 may also include opposing ends 157, 158 that are perpendicular to first and second sides 232, 236. Ends 157, 158 are distinguishable from sides 232, 236 because they do not include shoulders 230, 234 (or z-stop supports thereon). Further, sides 232, 236 are also longer than ends 157, 158. Where optical device 124 includes a laser, cavity 202 may be referenced as a 'laser attach cavity.'

Figure 8:
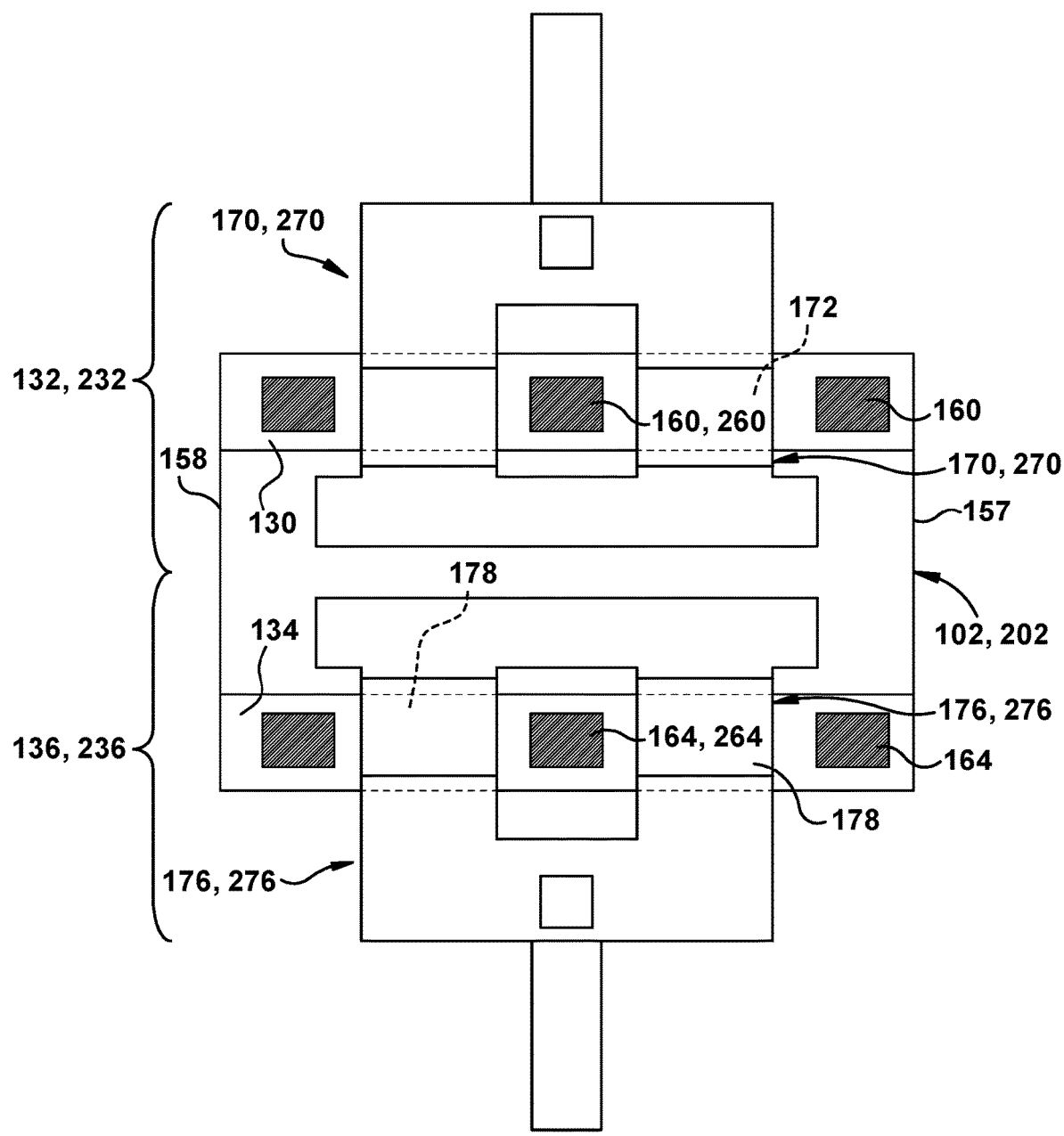
FIGS. 8-19 show schematic top-down views of wire layouts for a PIC structure, according to various embodiments of the disclosure.

As shown in FIGS. 5A-B, 6A and 7A, PIC structure 200 includes a first plurality of z-stop supports 260 for optical device 124. Each z-stop support 260 of a first plurality of z-stop supports is on a first support portion 262 of a first shoulder 230. As shown in FIGS. 5, 6B and 8, PIC structure 200 may also include second plurality of z-stop supports 264. Each z-stop support 264 of the second plurality of z-stop supports is on a second support portion 266 of a second shoulder 234. In contrast to the earlier-described embodiments, cavity 202 includes one or more cavity extensions 286 defined in substrate 104 on a first side 232 thereof. In addition, cavity 202 may include one or more cavity extensions 288 defined in substrate 104 on a second, opposing side 236 thereof. Cavity extensions 286, 288 typically extend between adjacent z-stop supports 260, 264, but can also extend adjacent end ones of the z-stop supports 260, 264 and their related support portions 262, 266. Any number of cavity extensions 286, 288 can be formed on each side between respective z-stop supports 260 or 264 and, more particularly, between adjacent first support portions 262 of first shoulder 230 or between adjacent second support portions 266 of second shoulder 234. In FIGS. 5A-B, two cavity extensions 286, 288 are shown on each side 232, 236; however, in FIGS. 6A-B, only one cavity extensions 286, 288 is shown on each side. In certain embodiments, sides 232, 236 of cavity 202 may be generally identical, i.e., symmetrical. However, as will be described, this is not necessary in all cases.

Each z-stop support 260, 264 may include any now known or later developed structure to vertically position optical device 124 within cavity 202. In this embodiment, z-stop supports 260, 264 include a portion of SOI layer 106 and BOX layer 108, but do not extend into base semiconductor layer 110. Hence, a thickness T5 of z-stop supports 260, 264 is determined by SOI layer 106 and BOX layer 108, and any other layer formed thereover, but not a depth thereof into base semiconductor layer 110 as in the earlier-described embodiment. First support portion 262, 266 for a respective z-stop support 260, 264 includes a portion of base semiconductor layer 110. Thicknesses of z-stop supports 260, 264, as described herein, are calculated from an upper surface 250, 254 of respective first or second shoulders 230, 234.

As shown in FIGS. 5B, 6A and 7B, PIC structure 200 also includes a first wire 270 extending over first side 232 of cavity 202 and between at least two z-stop supports 260 of the first plurality of z-stop supports (on first side 232 of cavity 202). In this embodiment, a first portion 272 of first wire 270 extends over first side 232 of cavity 102 within cavity extension 286 of first shoulder 130, i.e., along vertical sidewall 240. More particularly, first wire 270 extends over first side 232 of cavity 202 in cavity extension 286 defined between first support portions 262 of first shoulder 230. Here, first portion 272 may be, but is not necessarily in all cases, between first support portion 262 for z-stop supports 260. PIC structure 200 may also include, as shown in FIGS. 5B, 6B, and 7B, a second wire 276 extending over second side 236 of cavity 202 and between at least two z-stop supports 264 of the second plurality of z-stop supports. Second wire portion 278 may be, but is not necessarily in all cases, between second support portions 266 for z-stop supports 264. In this embodiment, a second wire portion 278 of second wire 276 extends over second side 236 of cavity 202, i.e., along a vertical sidewall 242. More particularly, second wire 276 extends over second side 236 of cavity 202 in cavity extension 288 defined between second support portions 266 of second shoulder 234. Here, second wire portion 278 may be, but is not necessarily in all cases, between second support portions 266 for z-stop supports 264. Where both wires 270, 276 are provided, first wire 270 extends over first side 232 of cavity 202 in first cavity extension 286 defined between first support portions 262 of first shoulder 230, including along vertical sidewall 240. Further, second wire 276 extends over second side 236 of cavity 202 in second cavity extension 288 defined between second support portions 266 of second shoulder 234, including along vertical sidewall 242. In this embodiment, first and second wires 270, 276 do not necessarily have to be thinner than each of first and second plurality of z-stop supports 260, 264, although they can be, if desired.

As shown in FIGS. 7A-B, PIC structure 200 also includes optical device 124 positioned on first plurality of z-stop supports 260 in cavity 202 and electrically coupled to first wire 270. In addition, optical device 124 is positioned on second plurality of z-stop supports 264 in cavity 202 and electrically coupled to second wire 276. For example, where a laser is used, the laser is positioned on first plurality of z-stop supports 260 and on second plurality of z-stop supports 264 in the laser attach cavity. The laser is electrically coupled to first wire 270 and second wire 276. Wires 270, 276 can extend along lower surface 138 of cavity 202 in any manner to allow connection to optical device 124. Wires 270, 276 may be coupled to optical device 124 in any now known or later developed manner such as but not limited to solder 180 coupling wires 270, 276 to mating wire bond pads 182 on optical device 124. Wires 270, 276 can be coupled to other components as previously described relative to wires 170, 176 (FIGS. 2-4B), e.g., by way of contact vias 122 in uppermost dielectric layer(s) 120 of interconnect layers 112. Wires 270, 276 may be coupled to a power source (not shown) for communicating power to/from optical device 124, and/or any of the alternative devices previously listed herein relative to the FIGS. 2-4B embodiment.

First wire 170, 270 and second wire 176, 276 may include any now known or later developed wiring typically used for optical device attachment in a PIC structure. For example, the wires may include any now known or later developed conductive redistribution layer (RDL) including, for example, and a refractory metal liner with a copper layer thereover, and a gold layer over the copper layer. Some RDLs also include nickel. The refractory metal liner may include, for example, ruthenium (Ru), tantalum (Ta), titanium (Ti), tungsten (W), iridium (Ir), rhodium (Rh) and platinum (Pt), etc., or mixtures of thereof. Contact vias 122 may be set within an opening (not labeled for clarity) in uppermost dielectric layer 120 of interconnect layers 112.

Embodiments of the disclosure provide various technical advantages, examples of which are described and illustrated hereafter. As shown in FIGS. 3A-B and 6A-B, because of wires 170, 176, 270, 276 extending over sides 132, 136, 232, 236 (rather than out of ends 157, 158), the widths of the wires can be sized differently than normally allowed. For example, as shown in FIGS. 3A and 6A, first wire 170, 270 may have a width W1, i.e., as it exits cavity 102, 202 between z-stop supports, greater than a width W2 of each of the first plurality of z-stop supports 160, 260. In alternative embodiments, first wire 170, 270 may have a width W1 smaller than or equal to width W2 of z-stop supports 160, 260. In addition, as shown in FIGS. 3B and 6B, if desired, second wire 176, 276 may have a width W3 greater than a width W4 of each of the first plurality of z-stop supports 164, 264. In alternative embodiments, second wire 176, 276 may have a width W3 smaller than or equal to width W4 of z-stop supports 164, 264. The widths as used herein refer to a dimension in a direction parallel to sides 132, 136, 232, 236 of the respective cavity 102, 202. In this manner, first wire 170, 270 and/or second wire 176, 276 can be advantageously configured to reduce electromigration issues, improve heat dissipation, and reduce power consumption by the respective wire.

First wire 170, 270 and second wire 176, 267 can have any desired widths W1, W3 to accommodate different challenges. Further, first wire 170, 270 does not have to be the same width as second wire 176, 276, i.e., width W1 may not equal width W3. The widths may vary between the different embodiments also. In addition, while each wire is shown with a consistent width, except where they run along lower surface 138 of the cavity, the wires can change widths as they extend over the respective side of the cavity.

Figure 9:
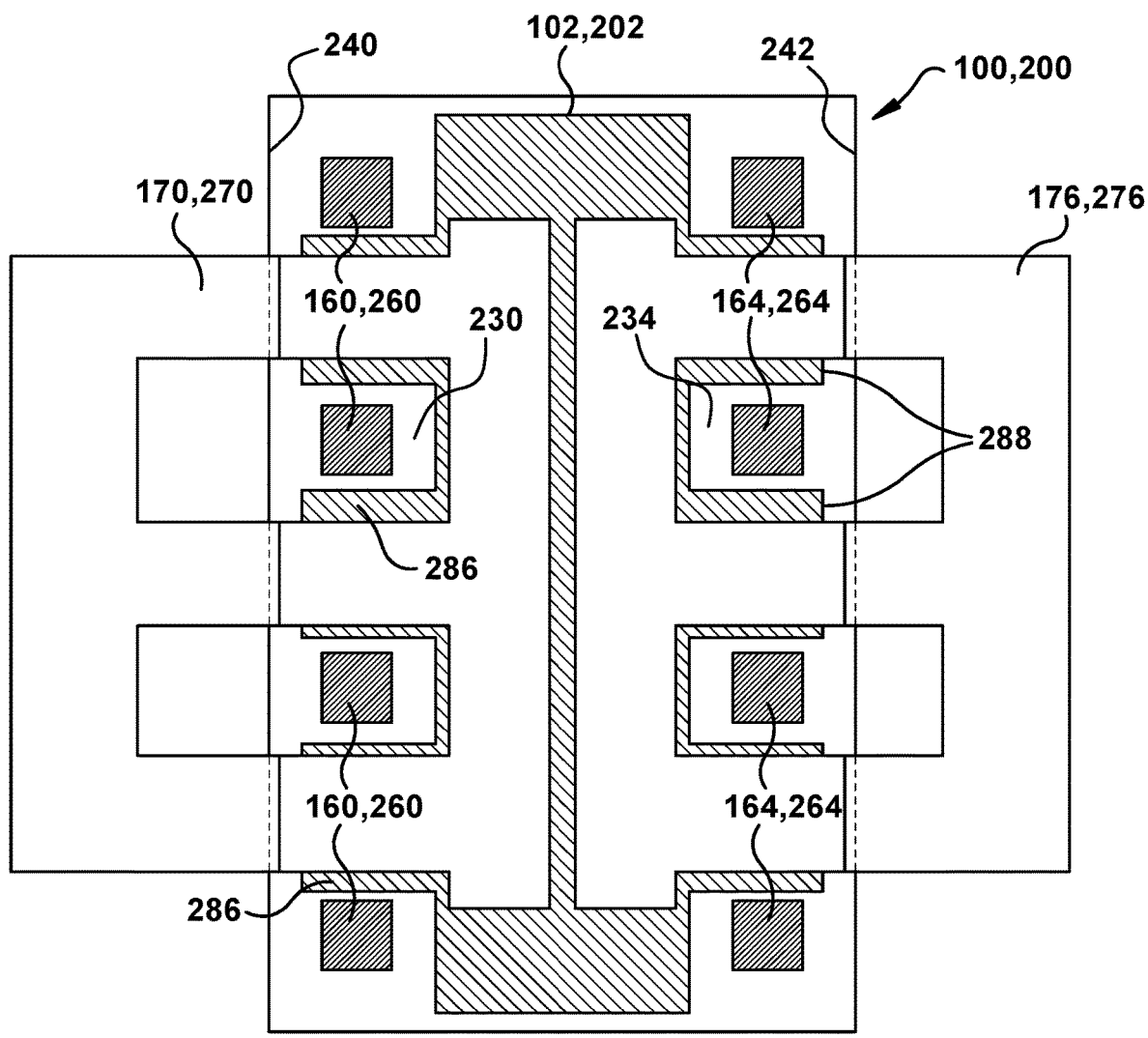

FIGS. 8-20 show schematic top-down views of wire layouts for a PIC structure according to various embodiments of the disclosure. Each PIC structure wire layout is illustrated in terms of one of the above-described embodiments, i.e., either FIGS. 2-4B or FIGS. 5A-7B, for brevity of the description. Despite the illustration with one of the embodiments, one with skill in the art will recognize that each of the various wire layouts in FIGS. 8-20 can be implemented using either arrangement described herein relative to FIGS. 2-4B or FIGS. 5A-7B. For example, FIG. 8 shows a top-down view of wiring layout per the FIGS. 2-4B embodiment, i.e., with wires 170, 176 thinner than respective z-stop supports 160, 164 and wire portions 172, 178 extending over of the shoulders 130, 134. Similarly, FIG. 9 shows a top-down view of a similar wiring layout (three wires over each side rather than two wires in FIG. 8) per the FIGS. 5A-7B embodiment, i.e., with wires 270, 276 extending along vertical sidewalls 240, 242 within cavity extensions 286, 288 within shoulders 230, 234. Reference numbers for both embodiments are provided in FIGS. 8-20 despite only one embodiment being shown to indicate the wire layouts provided are applicable regardless of the embodiment.

Figure 10:
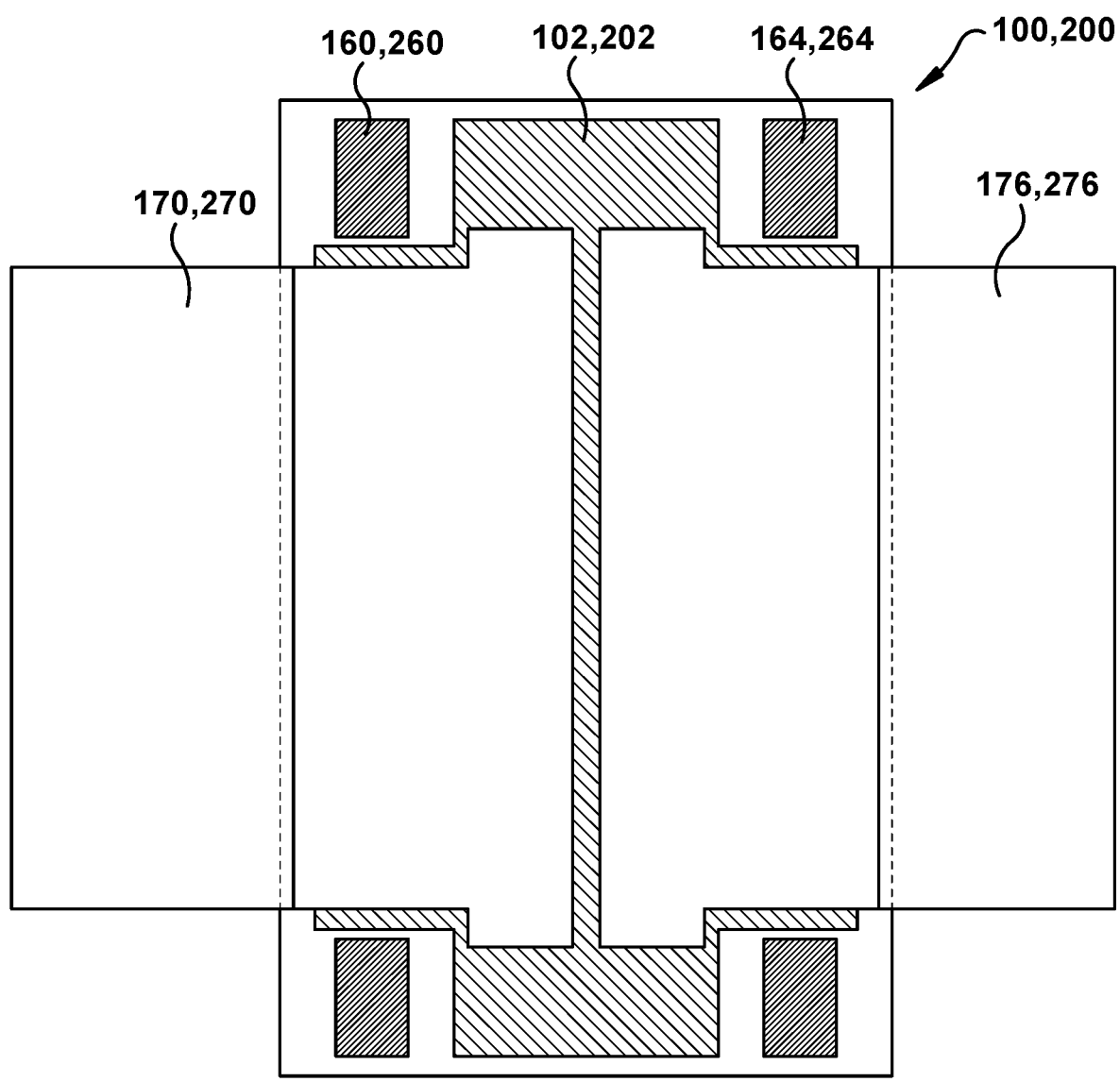
Figure 14:
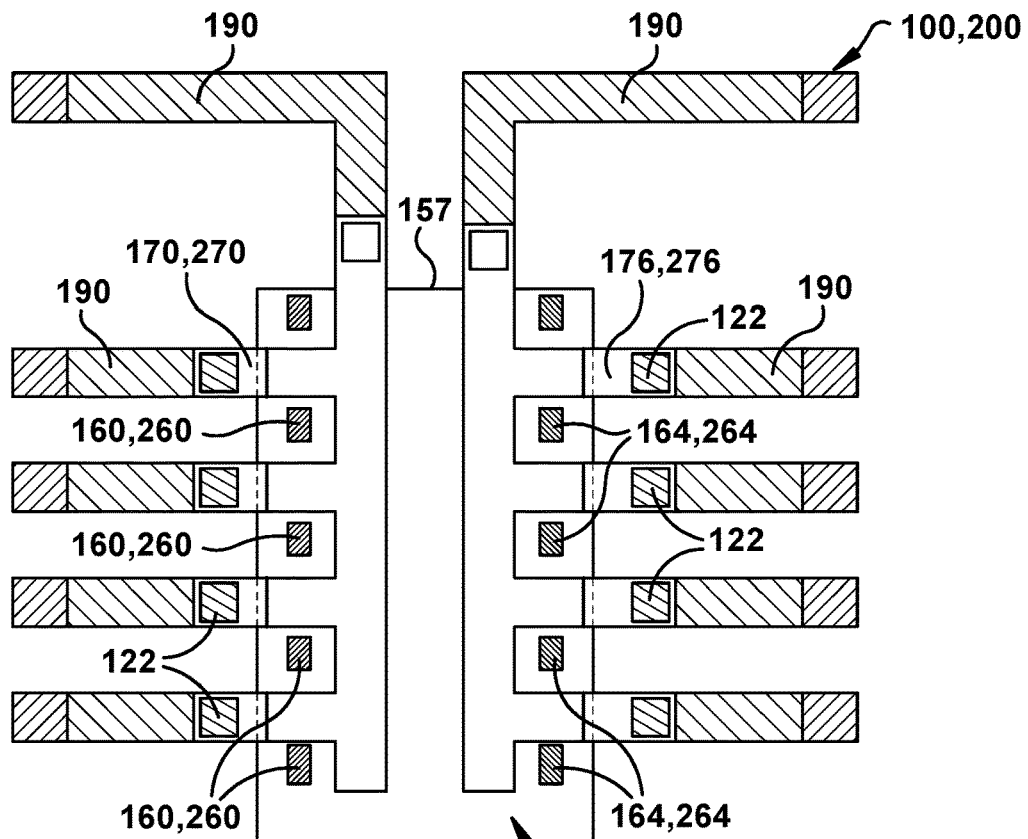
Figure 15:
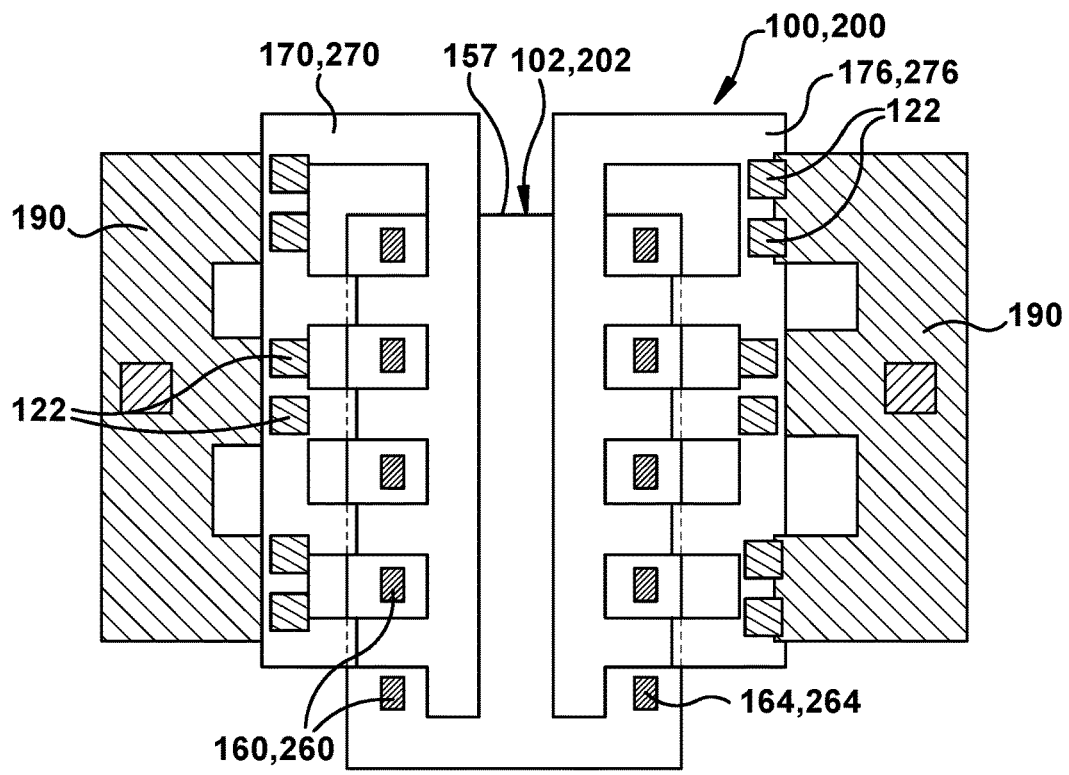

FIG. 8 shows an embodiment in which first wire 170, 270 also extends laterally around at least one of first plurality of z-stop supports 160, 260, such that two wires extend over side 132, 232. In other words, each wire 170, 270 has two interconnected paths or portions extending over side 132, 232. Second wire 176, 276 may also extend laterally around at least one of first plurality of z-stop supports 164, 264, such that two wires extend over side 136, 236. In other words, each wire 176, 276 has two interconnected paths or portions extending over side 136, 236. Where both wires are used, first wire 170, 270 extends over first side 132, 232 of cavity 102, 202 and around at least one of the first plurality of z-stop supports 160, 260, and second wire 176, 276 extends over second side 136, 236 of cavity 102, 202 and around at least one of the second plurality of z-stop supports 164, 264. The segregation of each wire into different paths around respective z-stop supports may provide advantages such as reduced electromigration issues, increased heat dissipation, and reduced power consumption by the respective wire. The number of segregations and paths of each wire on each side of the cavity can be customized to any number. For example, FIG. 8 shows two paths on each side around respective z-stop supports. FIG. 9 shows an embodiment in which each wire 170, 270, 176, 276 is segregated into three paths, each around two z-stop supports. FIG. 10 shows an embodiment in which each wire 170, 270, 176, 276 has only one path over each side and does not extend around any z-stop supports, i.e., just between z-stops supports. Other numbers of paths are also possible, for example, FIG. 14 shows wires including four paths over each side, and FIG. 15 shows wires including five paths over each side. More paths are also possible.

Figure 11:
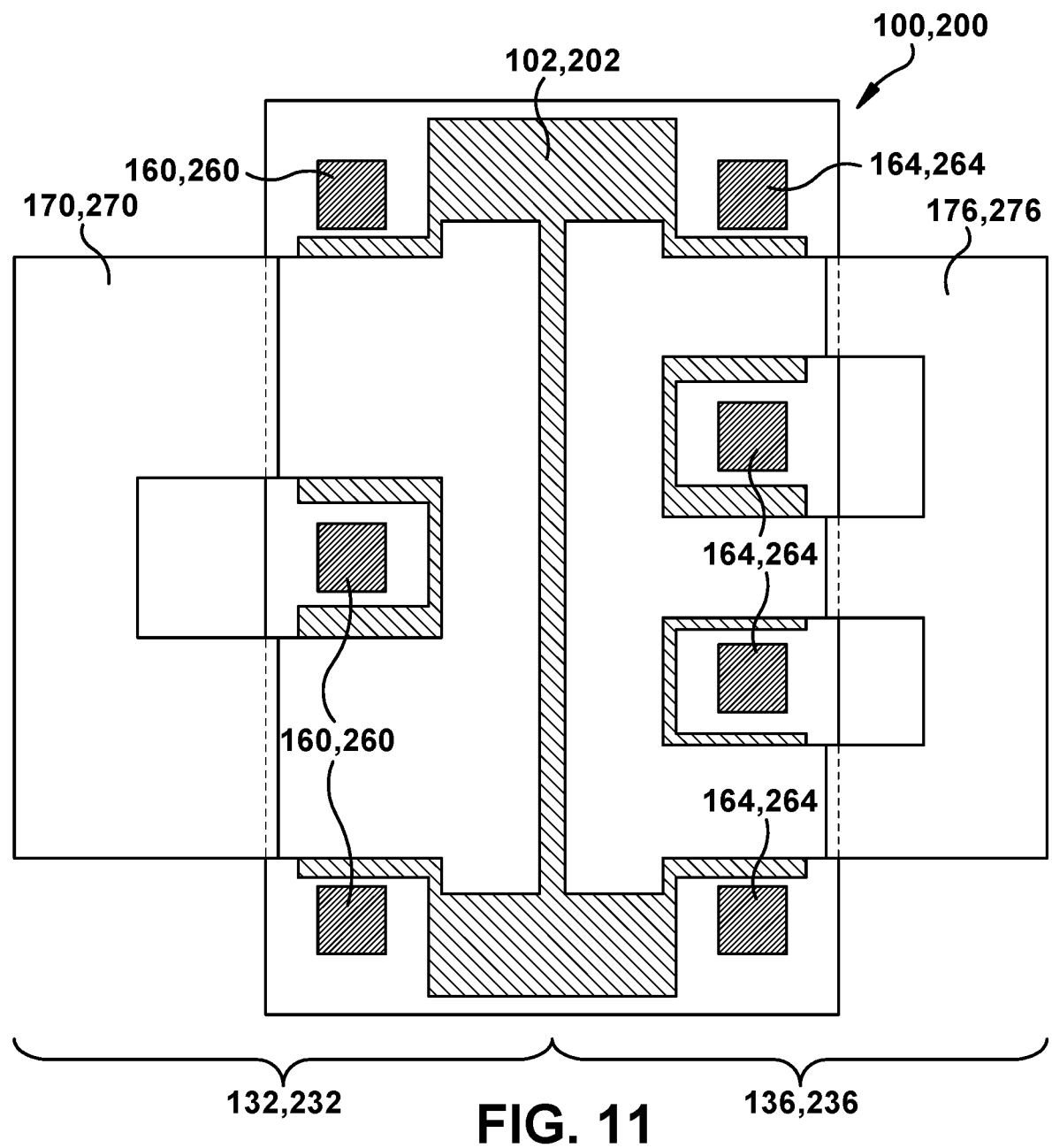

FIGS. 8-10 show embodiments in which wires on each side are symmetrical. In contrast, FIG. 11 shows an embodiment in which wires on each side are asymmetrical. In the example shown, first side 132, 232 includes two paths for first wire 170, 270 around one z-stop support 160, 260, and second side 136, 236 includes three paths for second wire 176, 276 around two z-stop supports 164, 264. The wire paths may also have different widths. It will be apparent that a wide variety of asymmetric arrangements are possible.

Figure 12:
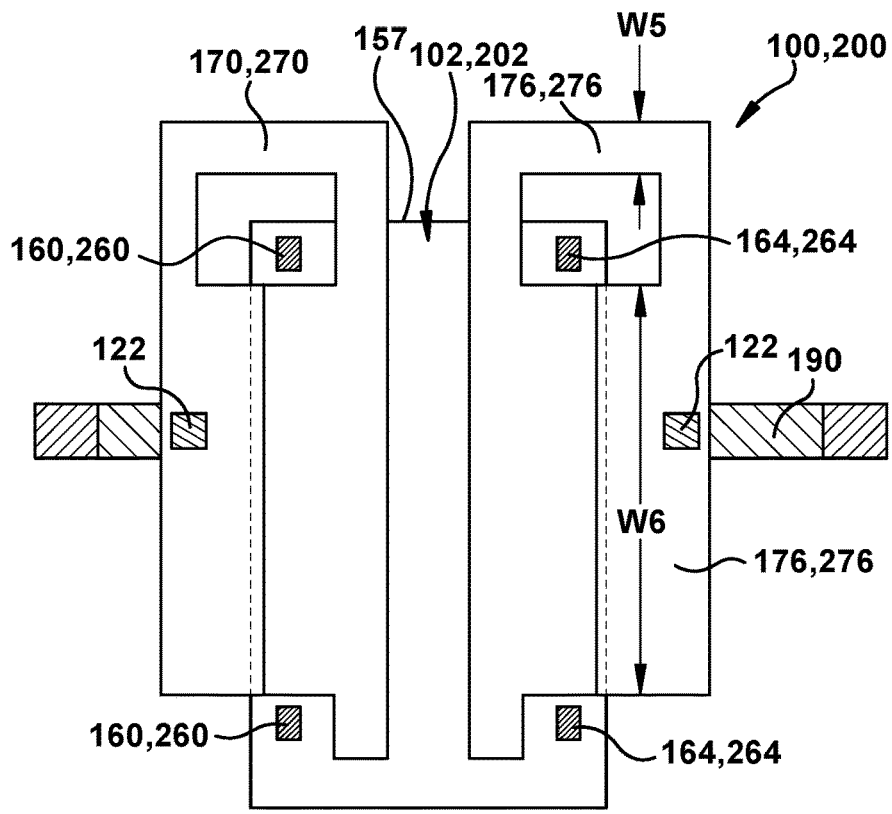
Figure 13:
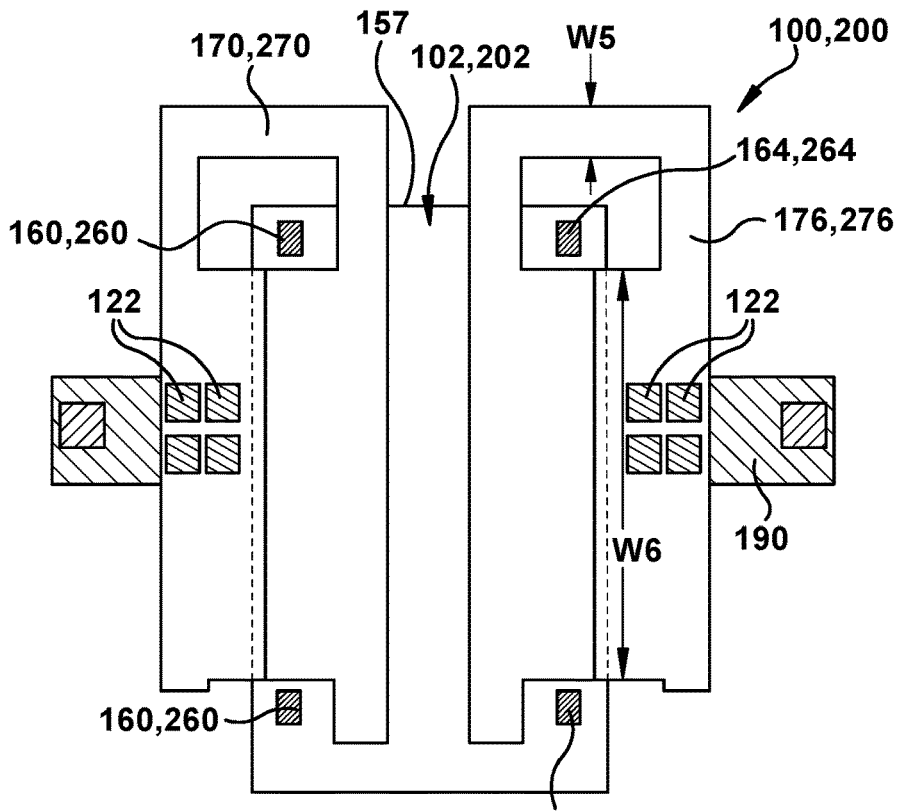

FIGS. 12 and 13 show embodiments in which each wire extends around a z-stop support 160, 260 or 164, 264 on each side of cavity 102, 202, and has paths having different widths W5, W6. Different wire layouts within cavity 102, 202 can also allow for customization of contact vias 122. FIG. 12 shows a single contact via 122 on each side, and FIG. 13 has a more than one contact via 122 on each side.

Figure 16:
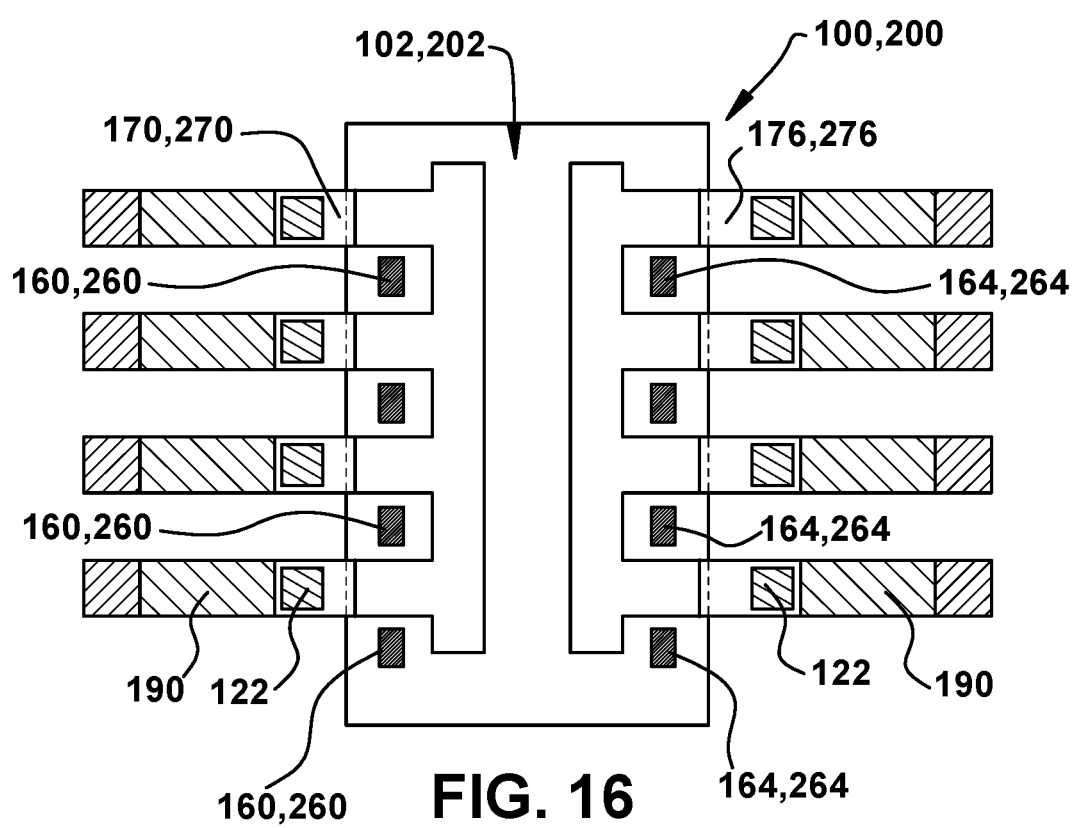

Aluminum wires 190 in BEOL interconnect layers 112 (FIGS. 4A, 7B) to contact vias 122 can also be customized. For example, FIG. 14 shows an aluminum interconnect wire 190 to each contact via 122 on each side, and FIG. 15 shows a single aluminum interconnect wire 190 coupled to the single contact via 122 on each side, and around a z-stop support 160, 260. In FIGS. 12-15, wires 170, 270 and 176, 276 also extend out of end 157 of cavity 102, 202. FIG. 16 shows the FIG. 14 embodiment without wires 170, 270 and 176, 276 extending out of end 157.

Figure 17:
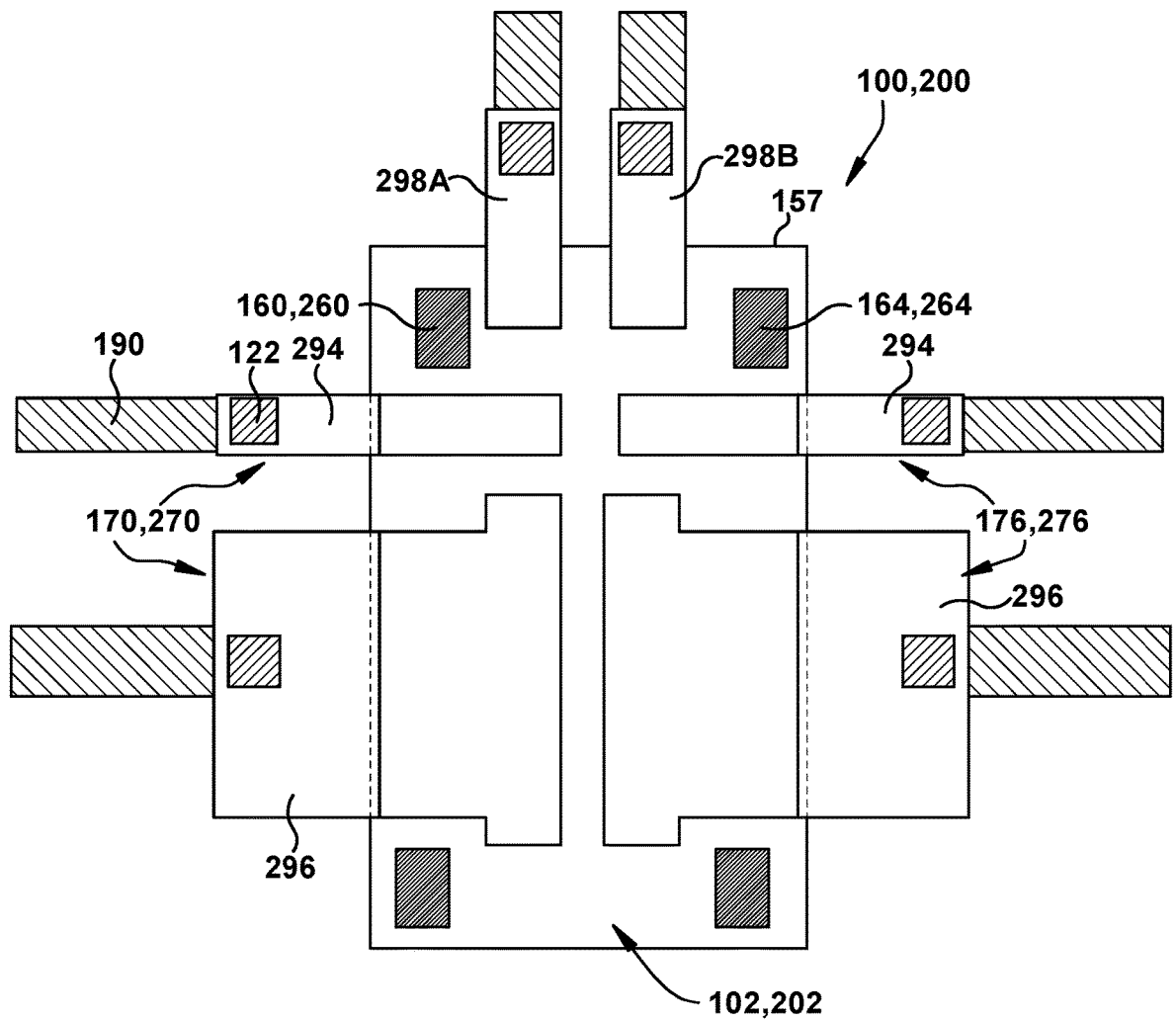
Figure 18:
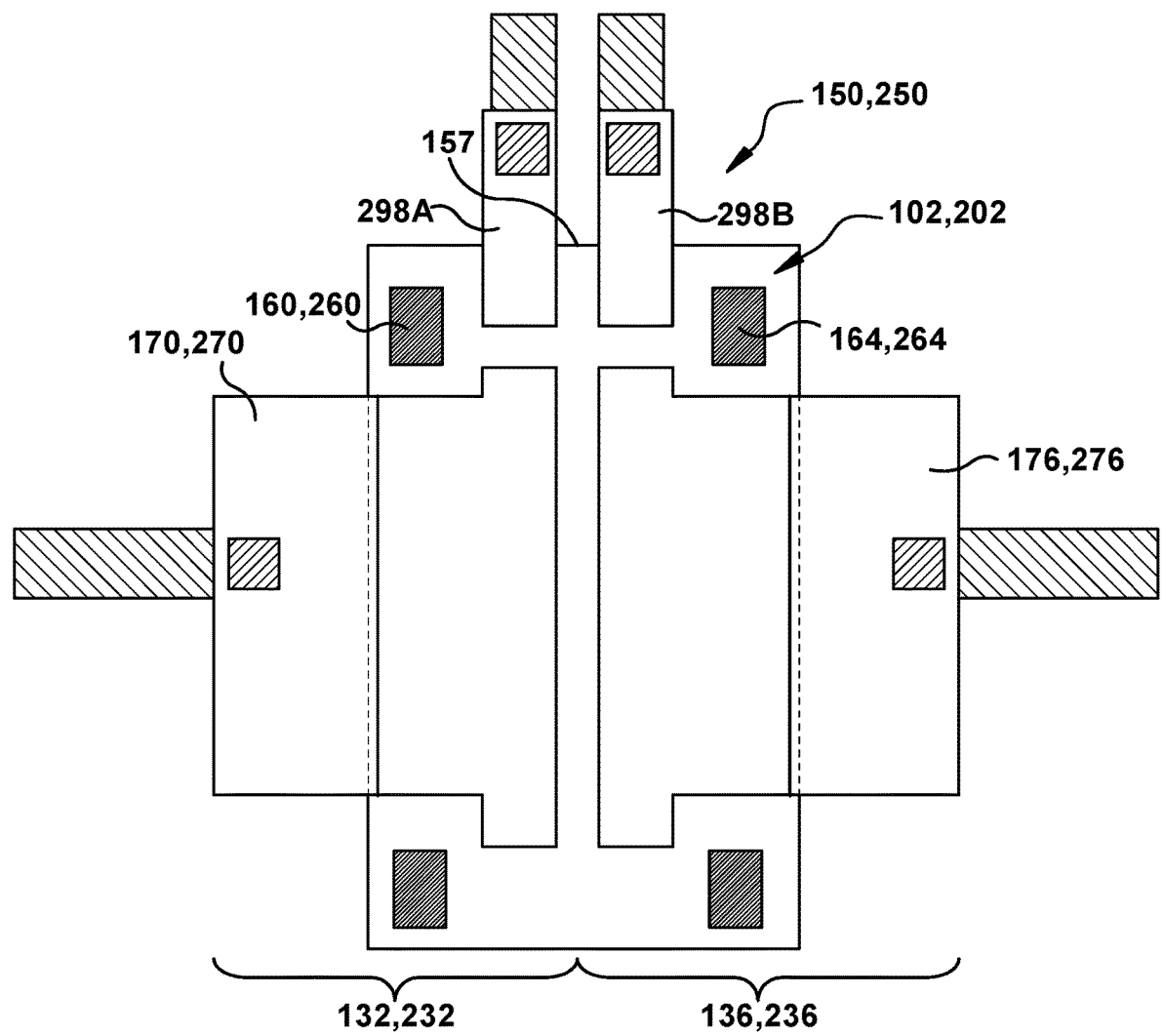
Figure 19:
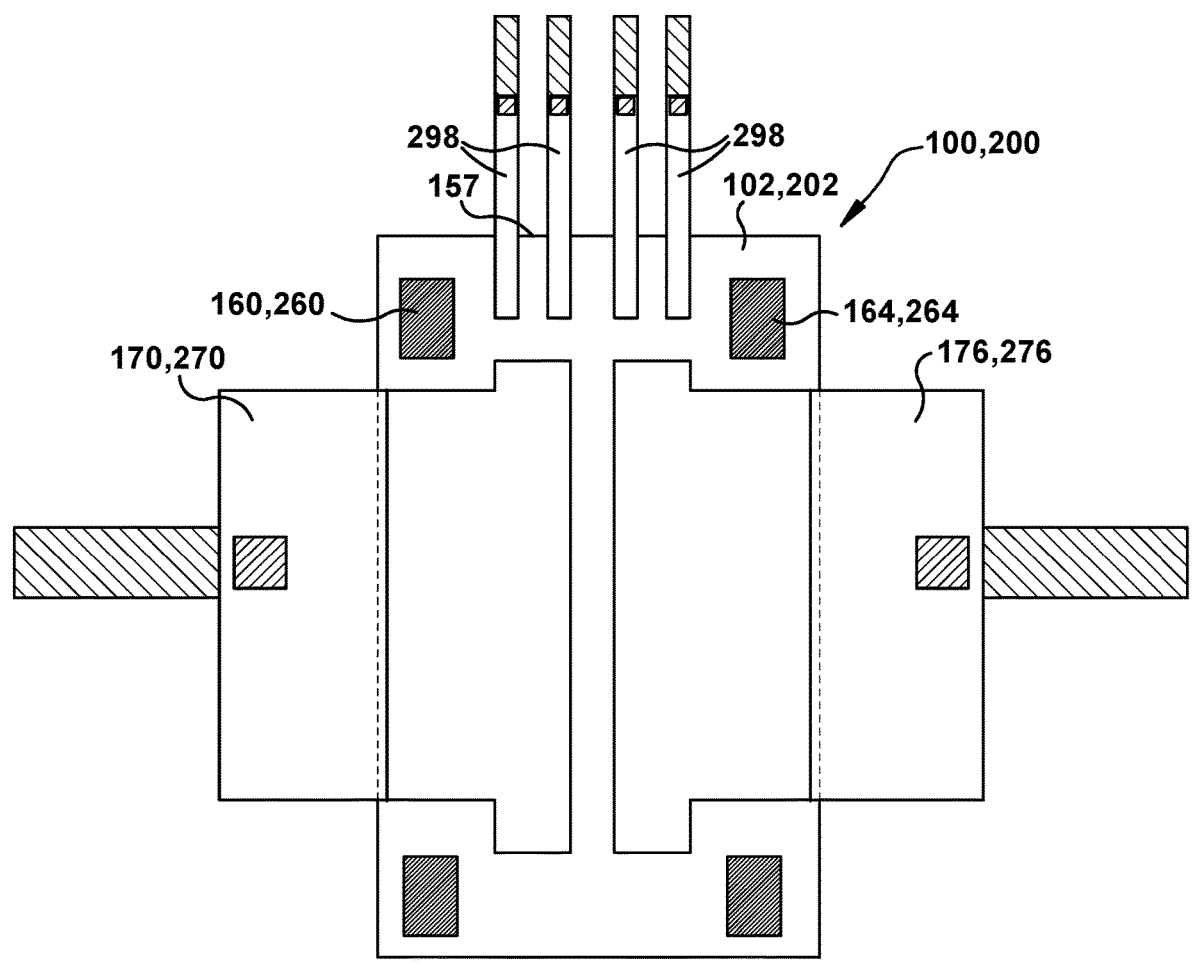

FIG. 17 shows an embodiment in which each wire 170, 270 or 176, 276 includes a first wire portion 294 and a second, electrically separate wire portion 296. First and second wire portions 294, 296 communicate different electrical signals to optical device 124. For example, wire portions 296 may communicate electrical power, while portions 294 communicate control signals, e.g., sensor feedback, operational control instructions, etc. In FIG. 17, another set of wires 298A, B also extend out of end 157 of cavity 102, 202, which allows for another electrical signal to be communicated to optical device 124, e.g., sensor feedback, operational control instructions, etc. FIG. 18 shows an embodiment similar to FIG. 10 in which each wire 170, 270, 176, 276 has only one path over each side and does not extend around any z-stop supports, only between z-stop supports 160, 260 or 164, 264. FIG. 18 also shows another set of additional wires 298A, B (e.g., two) extending out of end 157 of cavity 102, 202. In FIGS. 17 and 18, one or more wires 298A, 298B extend along lower surface 138 of cavity 102, 203 and through or over end 157 of cavity 102, 202 that is perpendicular to first side 132, 232 or second side 136, 236, respectively. Wire(s) 298A, 298B are electrically coupled to optical device 124 similarly to wires 170, 270 or 176, 276, e.g., solder and wire bond pads. Side wire(s) 170, 270 and/or 176, 276 can be wider than wires 298A, 298B. In one example, side wire(s) 170, 270, 176, 276 can deliver power, while wire(s) 298A, 298B deliver control signals. Any number of additional wires 298A, B may be used. FIG. 19 shows an embodiment similar to FIG. 18 in each wire 170, 270, 176, 276 has only one path over each side and does not extend around any z-stop supports, but four wires 298 extend out of or over end 157 of cavity 102, 202. Wires 298 can be used for any electrical signal. In this manner, any number of different electrical signals can be communicated to optical device 124 using wires 170, 270, 176, 276 and/or additional wires 298.

Figure 20:
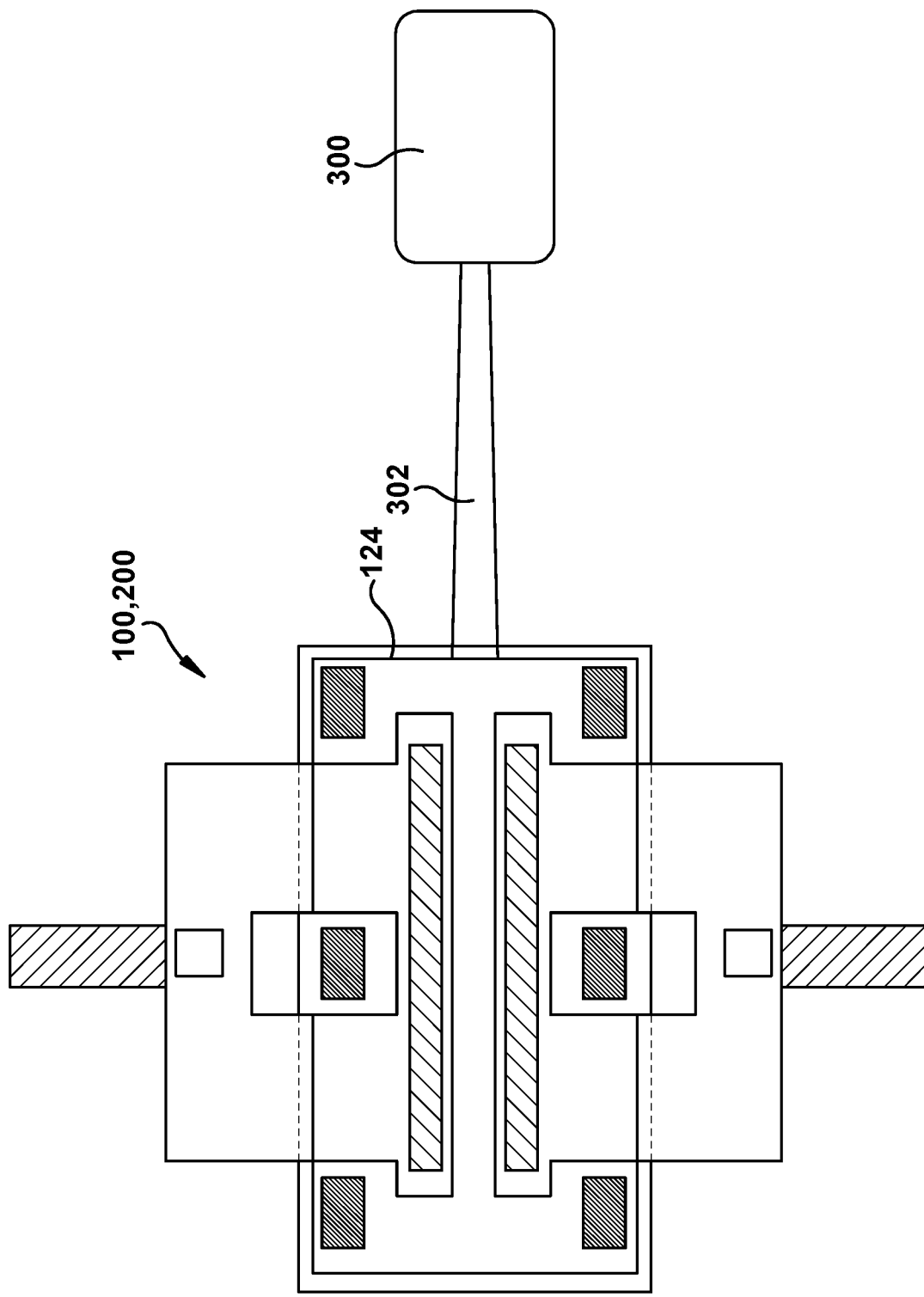
FIG. 20 shows a schematic top-down view of a PIC structure including an optical waveguide and functional components of the PIC structure, according to embodiments of the disclosure.

In certain embodiments, optical device 124 may include a laser. In this case, first plurality of z-stop supports 160, 260 support the laser in cavity 102, 202, and second plurality of z-stop supports 164, 264 support the laser in cavity 102, 202. As shown in FIG. 20, PIC structure 100, 200 may also include optical waveguide 302 in substrate 104 and in optical communication with the laser or other form of optical device 124. In this manner, optical device 124, e.g., a laser, may optically communicate with other functional components 300 of PIC structure 100, e.g., photodetectors, sensors, monitors, CMOS devices, via any form of optical waveguide, e.g., silicon, silicon nitride, within substrate 104.

Figure 21A:
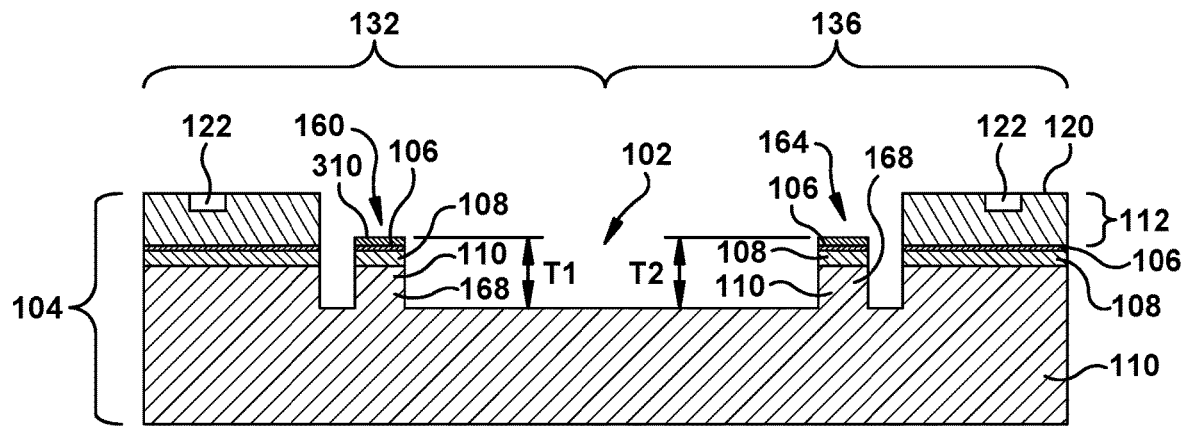
FIGS. 21A-C show cross-sectional views of a method, according to embodiments of the disclosure.
Figure 21B:
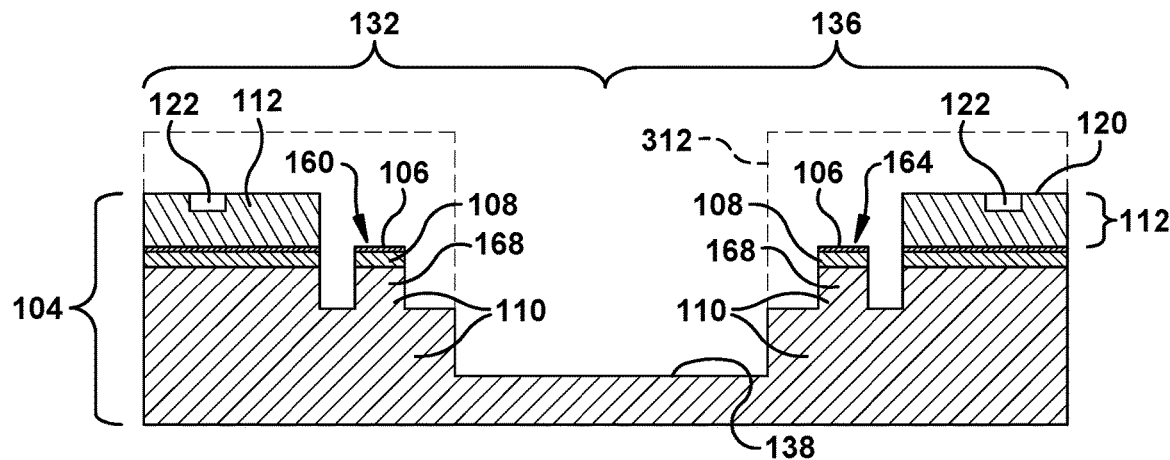
Figure 21C:
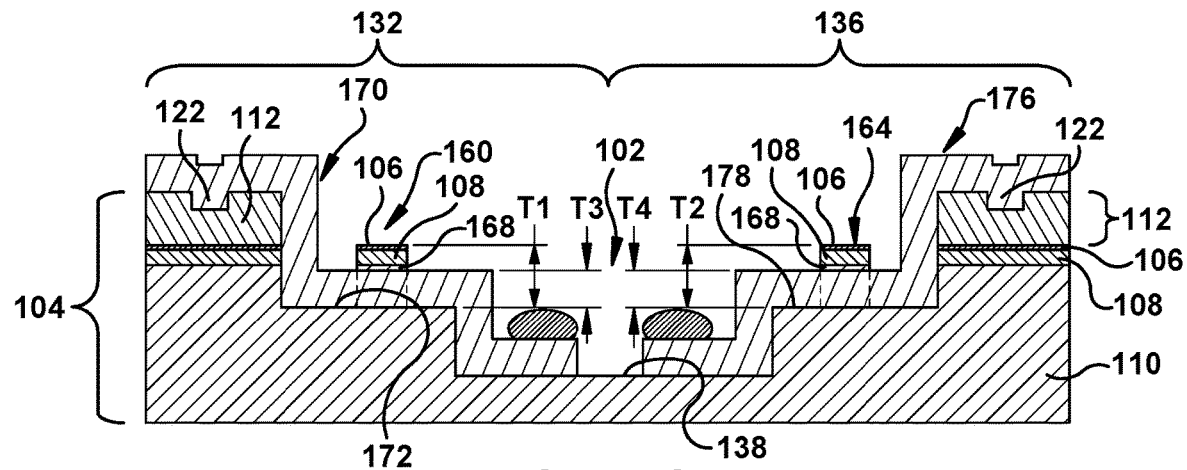
Figure 22A:
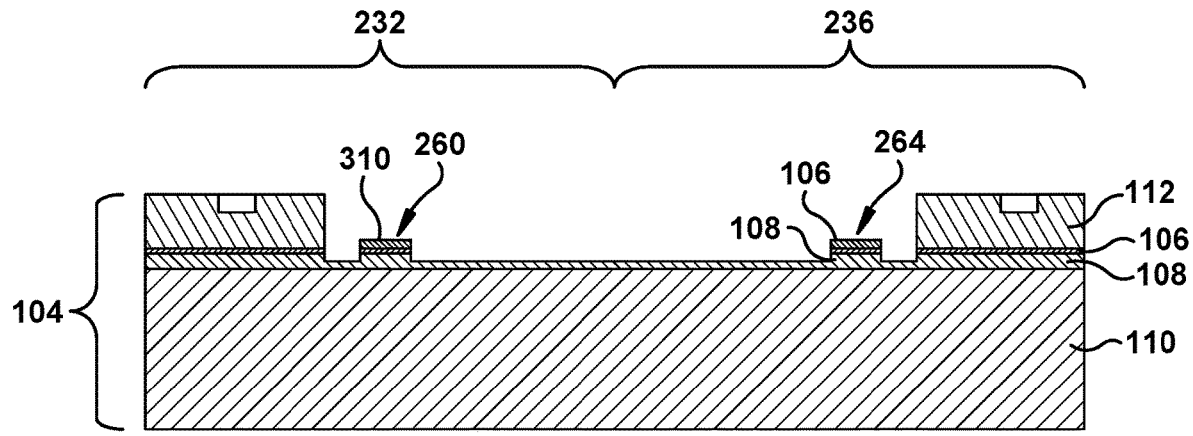
FIGS. 22A-C show cross-sectional views of a method, according to embodiments of the disclosure.
Figure 22B:
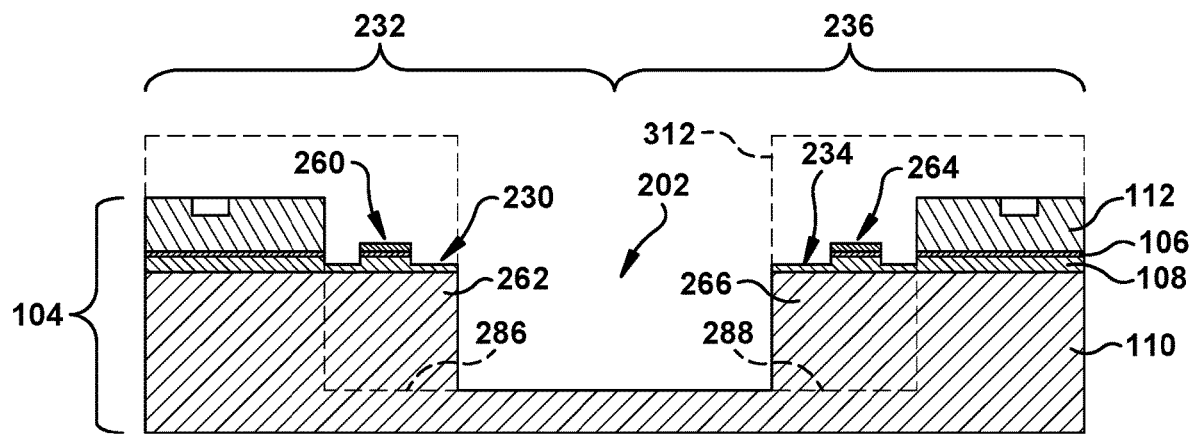
Figure 22C:
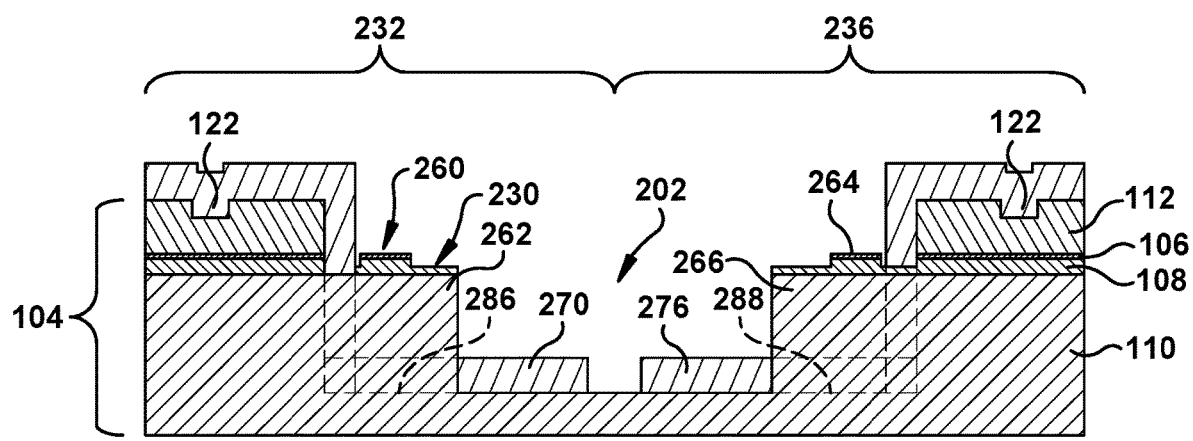

FIGS. 21A-C show cross-sectional views of a method of forming PIC structure 100 according to the FIGS. 2-4B embodiment, and FIGS. 22A-C show cross-sectional views of a method of forming PIC structure 200 according to the FIGS. 5A-7B embodiment. The wire layouts illustrated herein, e.g., in FIGS. 2-20, can be formed by either embodiment.

FIG. 21A shows forming a plurality of z-stop supports 160, 164 on a substrate 104. Substrate 104 is as described herein and can be formed using any know known or later developed semiconductor fabrication techniques. This process may include performing a first recess lithography and etching process. This process may include first opening interconnect layers 112 by forming a mask (not shown) and etching to SOI layer 106, and then forming a mask 310 over SOI layer 106 where z-stop supports 160, 164 are desired, and etching through BOX layer 108 into part of base semiconductor layer 110. In this fashion, z-stop supports 160, 164 have a larger thickness T1, T2 than just SOI layer 106 and BOX layer 108. Any appropriate mask and etching process can be employed. When complete, mask 310 can be removed using any appropriate process.

FIG. 21B shows forming cavity 102 for receiving optical device 124 in substrate 104 adjacent each of the plurality of z-stop supports 160, 164. Cavity 102 forming includes forming first shoulder 130 at first side 132 thereof and second shoulder 134 at second side 136 thereof. Shoulders 130, 134 are continuous into and out of the page, as in FIGS. 3A-B. Cavity 102 forming in this setting can include a second recess lithography and etching process, which removes more of base semiconductor layer 110. Any appropriate mask 312 (dashed box) and etching process can be employed. When complete, mask 312 can be removed using any appropriate process.

FIG. 21C shows forming at least one wire 170, 176 extending over side(s) 132, 136 of cavity 102 and, as shown in FIGS. 2, 3A-B, laterally between at least two z-stop supports 160, 164 of the plurality of z-stop supports. (Note, FIG. 21C is a composite cross-section (of FIGS. 4A-B showing z-stop supports 160, 164 (indicated in part by dashed line) and wires 170, 176 together.) The wire layout can have any arrangement as described herein. Wires 170, 176 can be formed using any now known or later developed process for forming a wire, such as an RDL. The RDL can be formed by electro-plating. The liner of the RDL can be formed by sputtering deposition. The thicker z-stop supports 160, 164 create room for wires 170, 176 to pass over a respective side 132, 136 under z-stop supports 160, 164 and over portions 172, 178 of the respective shoulders 130, 134. That is, z-stop supports 160, 164 extend above wires 170, 176. FIG. 4 shows positioning an optical device 124 on plurality of z-stop supports 160, 164 in cavity 102 and electrically coupling optical device 124 to the at least one wire 170, 176. Optical device 124 may be positioned and connected using any now known or later developed technique, e.g., pick-and-place processing and solder welding.

With reference to FIGS. 22A-C, FIG. 22A shows forming a plurality of z-stop supports 260, 264 on substrate 104. Substrate 104 is as described herein and can be formed using any know known or later developed semiconductor fabrication techniques. This process may include performing a first recess lithography and etching process. This process may include first opening interconnect layers 112 by forming a mask (not shown) and etching to SOI layer 106, and then forming a mask 310 over SOI layer 106 where z-stop supports 260, 264 are desired, and etching into BOX layer 108. Any appropriate mask and etching process can be employed. When complete, mask 310 can be removed using any appropriate process.

FIG. 22B shows forming cavity 202 for receiving optical device 124 according to the FIGS. 5A-7B embodiments. Here, cavity 202 forming includes forming shoulders 230, 234, but with a cavity extension 286, 288 in each shoulder 230, 234 that separates the respective shoulder into a plurality of support portions 262, 266. Cavity 202 forming in this setting can include a second recess lithography and etching process, but with a mask 312 exposing areas of each shoulder 230, 234 in which cavity extensions 286, 288 are desired. In this case, as shown in FIGS. 5A-7B, z-stop supports 260, 264 includes just SOI layer 106 and BOX layer 108 on support portions 262, 266 of shoulders 230, 234. Each z-stop support 260, 264 is positioned on support portion(s) 262, 266. Any number of support portions 262, 266 and related cavity extensions 286, 288 (see dashed lines in FIG. 22B) can be formed in this manner. Any appropriate mask 312 and etching process can be employed. When complete, mask 312 can be removed using any appropriate process.

FIG. 22C shows forming at least one wire 270, 276 extending over side(s) 232, 236 of cavity 202 and, as shown in FIGS. 5B and 6A-B, laterally between at least two z-stop supports 260, 264 of the plurality of z-stop supports. (Note, FIG. 22C is a composite cross-section (of FIGS. 7A-B showing z-stop supports 260, 264 and wires 270, 276 (indicated in part by dashed lines) together.) More particularly, forming at least one wire 270, 276 includes forming the at least one wire to extend over side 232, 236 of cavity 202 in between at least two of the plurality of support portions 262, 266 of the respective shoulder 230, 234. The wire layout can have any arrangement as described herein. Wires 270, 276 can be formed using any now known or later developed process for forming a wire, such as an RDL. The RDL can be formed by electro-plating. The liner of the RDL can be formed by sputtering deposition. FIG. 7A shows positioning an optical device 124 on plurality of z-stop supports 260, 264 in cavity 202 and electrically coupling optical device 124 to wire(s) 270, 276. Optical device 124 may be positioned and connected using any now known or later developed technique, e.g., pick-and-place processing and solder welding.

Embodiments of the disclosure provide various technical and commercial advantages, examples of which are discussed herein. The PIC structure has electrical connections, i.e., wires, between z-stop supports on a side of an attach cavity for an optical device. The electrical connections between z-stop supports on sides of the cavity, rather than just at an end of the cavity, allows larger sized electrical connections to the optical device to mitigate electromigration issues. In addition, the electrical connections increase thermal dissipation, lower power consumption, and increase electrical input/output (I/O) capabilities and options. The increased I/O capabilities enable, for example, additional CMOS-optical device communication, sensors, controls, monitors, feedback loops, thermal management, driver circuits, and other device functions.

The methods as described above is used in the fabrication of PIC structures or chips. The resulting PIC structures or chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A photonic integrated circuit (PIC) structure, comprising:
   a substrate;
   a cavity defined in the substrate, the cavity including a first shoulder at a first side of the cavity;
   a first plurality of z-stop supports for an optical device, each z-stop support of the first plurality of z-stop supports on a first support portion of the first shoulder;
   a first wire extending over the first side of the cavity and between at least two z-stop supports of the first plurality of z-stop supports; and
   an optical device positioned on the first plurality of z-stop supports in the cavity and electrically coupled to the first wire.

2. The PIC structure of claim 1, wherein the first wire extends over the first side of the cavity in a cavity extension defined between the first support portions of the first shoulder.

3. The PIC structure of claim 1, wherein the first wire extends over the first side of the cavity including over a portion of the first shoulder, and wherein the first wire is thinner than each of the first plurality of z-stop supports.

4. The PIC structure of claim 3, wherein the substrate includes a base semiconductor layer, and each z-stop support includes a lowermost section including a portion of the base semiconductor layer.

5. The PIC structure of claim 1, wherein the first wire has a width greater than a width of each of the first plurality of z-stop supports.

6. The PIC structure of claim 1, wherein the first wire also extends laterally around at least one of the first plurality of z-stop supports.

7. The PIC structure of claim 1, wherein the first wire includes a first wire portion and a second, electrically separate wire portion, the first and second wire portions communicating different electrical signals to the optical device.

8. The PIC structure of claim 1, wherein the cavity defined in the substrate further includes a second shoulder on a second, opposing side of the cavity from the first side, and further comprising:
  a second plurality of z-stop supports for the optical device, each z-stop support of the second plurality of z-stop supports on a second support portion of the second shoulder; and
  a second wire extending over the second side of the cavity and between at least two z-stop supports of the second plurality of z-stop supports,
  wherein the optical device is positioned on the second plurality of z-stop supports in the cavity and electrically coupled to the second wire.

9. The PIC structure of claim 8, wherein at least one of:
  the first wire extends over the first side of the cavity and around at least one of the first plurality of z-stop supports, and
  the second wire extends over the second side of the cavity and around at least one of the second plurality of z-stop supports.

10. The PIC structure of claim 8, wherein at least one of:
  the first wire extends over the first side of the cavity in a first cavity extension defined between the first support portions of the first shoulder, and
  the second wire extends over the second side of the cavity in a second cavity extension defined between the second support portions of the second shoulder.

11. The PIC structure of claim 8, wherein at least one of:
  the first wire extends over the first side of the cavity including over a first portion of the first shoulder, wherein the first wire is thinner than each of the first plurality of z-stop supports, and
  the second wire extends over the second side of the cavity including over a second wire portion of the second shoulder, wherein the second wire is thinner than each of the second plurality of z-stop supports.

12. The PIC structure of claim 11, wherein the substrate includes a base semiconductor layer, and each z-stop support includes a lowermost section including a portion of the base semiconductor layer.

13. The PIC structure of claim 1, further comprising a second wire extending along a lower surface of the cavity and through an end of the cavity that is perpendicular to the first side, the second wire electrically coupled to the optical device, wherein the first wire is wider than the second wire.

14. The PIC structure of claim 1, wherein the optical device includes a laser, wherein the first plurality of z-stop supports support the laser in the cavity, and further comprising an optical waveguide in the substrate in optical communication with the laser.

15. A photonic integrated circuit (PIC) structure, comprising:
  a substrate;
  a laser attach cavity defined in the substrate, the laser attach cavity including a first shoulder on a first side of the laser attach cavity and a second shoulder on a second, opposing side of the laser attach cavity from the first side;
  a first plurality of z-stop supports supporting a laser, each z-stop support of the first plurality of z-stop supports on a support portion of the first shoulder;
  a second plurality of z-stop supports supporting the laser, each z-stop support of the second plurality of z-stop supports on a support portion of the second shoulder;
  a first wire extending over the first side of the cavity and between two of the first plurality of z-stop supports;
  a second wire extending over the second side of the cavity and between two of the second plurality of z-stop supports; and
  a laser positioned on the first plurality of z-stop supports and on the second plurality of z-stop supports in the laser attach cavity, the laser electrically coupled to the first wire and the second wire.

16. The PIC structure of claim 15, wherein the first wire extends over the first side of the laser attach cavity in a cavity extension defined between the support portions of the first shoulder, and
  wherein the second wire extends over the second side of the laser attach cavity in a cavity extension defined between the support portions of the second shoulder.

17. The PIC structure of claim 15, wherein the substrate includes a base semiconductor layer, and each z-stop support includes a lowermost section including a portion of the base semiconductor layer,
  wherein the first wire extends over the first side of the laser attach cavity including over a portion of the first shoulder, and wherein the first wire is thinner than each of the first plurality of z-stop supports, and
  wherein the second wire extends over the second side of the laser attach cavity including over a portion of the second shoulder, and wherein the second wire is thinner than each of the second plurality of z-stop supports.

18. A method comprising:
  forming a plurality of z-stop supports on a substrate;
  forming a cavity for receiving an optical device in the substrate adjacent each of the plurality of z-stop supports, the cavity including a shoulder at a side thereof;
  forming at least one wire extending over the side of the cavity and laterally between at least two z-stop supports of the plurality of z-stop supports;
  positioning the optical device on the plurality of z-stop supports in the cavity; and
  electrically coupling the optical device to the at least one wire.

19. The method of claim 18, wherein forming the cavity includes forming a cavity extension in the shoulder that separates the shoulder into a plurality of support portions, the plurality z-stop support positioned on the plurality of support portions, and
  wherein forming the at least one wire includes forming the at least one wire to extend over the side of the cavity in between at least two of the plurality of support portions of the shoulder.

20. The method of claim 18, wherein the substrate includes a base semiconductor layer, and wherein:
- forming the plurality of z-stop supports further includes forming each z-stop support into a portion of the base semiconductor layer, and
- forming the at least one wire includes forming the at least one wire to extend over the side of the cavity including over a portion of the shoulder, and wherein the at least one wire is thinner than each of the plurality of z-stop supports.

* * * * *